(12) United States Patent
Park et al.

(10) Patent No.: US 12,007,808 B2
(45) Date of Patent: Jun. 11, 2024

(54) FOLDABLE ELECTRONIC DEVICE

(71) Applicant: Samsung Electronics Co., Ltd., Gyeonggi-do (KR)

(72) Inventors: Myeongsil Park, Gyeonggi-do (KR); Joohoon Lee, Gyeonggi-do (KR); Seonghoon Kim, Gyeonggi-do (KR); Jonghae Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 184 days.

(21) Appl. No.: 17/526,103

(22) Filed: Nov. 15, 2021

(65) Prior Publication Data

US 2022/0075413 A1 Mar. 10, 2022

Related U.S. Application Data

(63) Continuation of application No. PCT/KR2020/006452, filed on May 15, 2020.

(30) Foreign Application Priority Data

May 15, 2019 (KR) .......................... 10-2019-0057144

(51) Int. Cl.
*G06F 1/16* (2006.01)
*H05K 5/02* (2006.01)

(52) U.S. Cl.
CPC .......... *G06F 1/1618* (2013.01); *G06F 1/1641* (2013.01); *G06F 1/1643* (2013.01); *G06F 1/1681* (2013.01); *H05K 5/0226* (2013.01)

(58) Field of Classification Search
None
See application file for complete search history.

(56) References Cited

U.S. PATENT DOCUMENTS 8,902,597 B2 * 12/2014 Sato .................. G02F 1/133305
361/749
2009/0302760 A1 * 12/2009 Tchakarov ........ B32B 17/10541
313/504

(Continued)

FOREIGN PATENT DOCUMENTS

| KR | 10-2005-0046951 A | 5/2005 |
| KR | 10-2017-0030464 A | 3/2017 |

(Continued)

*Primary Examiner* — Anthony Q Edwards
*Assistant Examiner* — Rashen E Morrison
(74) *Attorney, Agent, or Firm* — Cha & Reiter, LLC

(57) ABSTRACT

An electronic device is disclosed, including a foldable housing defining a folding axis, a first housing defining a first and second surface, a second housing defining a third and fourth surface, a display spanning from the first surface to the third surface, the display including a first and second layer disposed parallel to the first and/or the third surface, wherein the first and second layers include multiple first conductive lines extending in parallel, wherein the second layer includes multiple second conductive lines extending in parallel perpendicular to the first conductive lines as to form a plurality of intersects, wherein the display includes multiple conductive vias to electrically couple the first and second multiple conductive lines, and wherein the conductive vias are disposed on the display outside of the folding region.

19 Claims, 17 Drawing Sheets

(56) References Cited

U.S. PATENT DOCUMENTS

| | | |
|---|---|---|
| 2011/0153263 A1 | 6/2011 | Oda et al. |
| 2015/0261057 A1 | 9/2015 | Harris et al. |
| 2018/0077810 A1 | 3/2018 | Moon et al. |
| 2018/0181224 A1 | 6/2018 | Li et al. |
| 2019/0110361 A1 | 4/2019 | Abe et al. |
| 2019/0189729 A1 | 6/2019 | Zhang et al. |

FOREIGN PATENT DOCUMENTS

| | | |
|---|---|---|
| KR | 10-2018-0029590 A | 3/2018 |
| KR | 10-2018-0086410 A | 7/2018 |

\* cited by examiner

FOLDABLE ELECTRONIC DEVICE

CROSS-REFERENCE TO RELATED APPLICATION(S)

This application is continuation of International Application No. PCT/KR2020/006452, filed on May 15, 2020, which claims priority to Korean Patent Application No. 10-2019-0057144 filed on May 15, 2019 in the Korean Intellectual Property Office, the disclosures of which are herein incorporated by reference.

BACKGROUND

1. Field

Certain embodiments of the disclosure relate to a foldable electronic device.

2. Description of the Related Art

An electronic device may be configured to perform a specific function according to an installed program, and examples thereof may include home appliances, electronic wallets, portable multimedia players, mobile communication terminals, tablet PCs, image/sound playback devices, desktop/laptop computers, vehicle navigation systems, and the like. For example, electronic devices may output stored information in the form of sounds or images. With the increased functional integration of electronic devices, and the widespread proliferation of high-speed high-capacity wireless communication, single electronic devices (such as, for example, mobile communication terminals) are increasingly equipped to execute various functions. For example, these devices may provide not only a communication function, but also an entertainment function (e.g., gaming), a multimedia function (e.g., music/moving image playback), communication and security functions for mobile banking and the like, scheduling functions, and electronic wallet functions. Accordingly, a large number of functions may now be integrated in a single electronic device. These electronic devices are also becoming increasingly compact and convenient for users to carry on their persons.

As mobile communication services expand to include multimedia service areas, users have grown accustomed to having voice communication, text messaging, and multimedia services provided all through a single electronic device. Larger display panels have also been incorporated on electronic devices, improving the multimedia experience for end users. Moreover, foldable electronic devices having flexible display panels disposed thereon have recently been released.

SUMMARY

An electronic device may include a touch panel configured to detect various types of inputs, including an input generated using a part of the user's body, an input generated through an external input device (for example, a stylus pen), and a contactless hover input.

In some implementations of the touch panel, a digitizer panel may be disposed inside the housing of the electronic device. According to an embodiment, the digitizer panel may be disposed near the display panel so as to form a magnetic field. An input device (such as a stylus pen having an EMR function) may detect a signal returned by the magnetic field, thereby allowing identification of a position of the input device.

If the electronic device is a foldable electronic device including multiple housing structures configured to rotate relative to one another, there is a risk of causing damage to the digitizer panel.

The digitizer panel may include multiple conductive lines configured to form a conductive loop for forming a magnetic field. This structure may be vulnerable to damage from physical impact and/or external forces. Furthermore, if an electronic device equipped with a flexible display and a digitizer panel undergoes repeated folding operations, the portion of the digitizer panel disposed near the 'crease' of the fold of the flexible display panel may be subject to various types of damage (such as cracks and ruptures), which may degrade the conductive lines of the digitizer panel.

For example, the digitizer panel may include an X-axis conductive line and a Y-axis conductive line, and may additionally include a conductive via, thereby electrically connecting the X-axis conductive line and the Y-axis conductive line. In some embodiments, if a via is formed in the folding region of the display panel, repeated folding operations may damage the via or may damage the conductive material forming the via. This may degrade the successful recognition ratio of the input device, resulting in erroneous operations of the electronic device when inputs are made through the input device, degrading the user's experience.

Certain embodiments of the disclosure may provide a foldable electronic device. The electronic device of the disclosure may include a flexible display panel and a touch panel disposed near the flexible display panel. In addition, certain embodiments of the disclosure may provide a structure configured to prevent damage to a conductive line included in the touch panel, at a position corresponding to the folding region of the display panel.

Certain embodiments of the disclosure may provide a structure configured to prevent damage to a magnetic shield sheet at a position corresponding to the folding region of the flexible display panel.

Certain embodiments of the disclosure may provide an electronic device including: a foldable housing, including a hinge structure defining a folding axis of the foldable housing, a first housing coupled to the hinge structure and including a first surface facing a first direction, and a second surface facing a second direction opposite to the first direction, and a second housing coupled to the hinge structure, including a third surface facing a third direction, and a fourth surface facing a fourth direction opposite to the third direction, the second housing folded toward the first housing around the hinge structure, and a display spanning across the first surface of the first housing to the third surface of the second housing, wherein the display includes a first layer and a second layer disposed substantially parallel with the first surface or the third surface, wherein the first layer, when viewed from above the first surface or the third surface, includes multiple first conductive lines extending parallel with each other in a fifth direction, wherein the second layer, when viewed from above the first surface or the third surface, includes multiple second conductive lines extending parallel in a sixth direction substantially perpendicular to the fifth direction, the multiple second conductive lines intersecting with the multiple first conductive lines, wherein the display includes multiple conductive vias formed between the first layer and the second layer to electrically couple at least a portion of the first multiple conductive lines and at least a portion of the second multiple conductive lines, and wherein the display comprises a folding region including the folding axis about which the housing is folded, and the conductive vias are disposed outside the folding region.

Various embodiments of the disclosure may provide an electronic device including: a foldable housing including a folding region where the electronic device is substantially folded about a folding axis, the foldable housing including a hinge structure including the folding axis; a first housing including a first surface facing a first direction and a second surface facing a second direction opposite to the first direction; and a second housing connected to the hinge structure, including a third surface facing a third direction and a fourth surface facing a fourth direction opposite to the third direction, and folded toward the first housing around the hinge structure; and a display extending from the first surface of the first housing to the third surface of the second housing, wherein the display includes a first layer including multiple first conductive lines of which at least a portion extends toward the fifth direction; a second layer including multiple second conductive lines of which at least a portion extends toward sixth direction substantially perpendicular to the fifth direction; a base layer disposed between the first layer and the second layer; and a conductive material formed to surround at least a portion of the first layer or at least a portion of the second layer and configured to form the multiple conductive vias, and wherein the first layer includes an opening formed at a first folding region defining a first boundary spaced a first distance apart from the folding axis.

Various embodiments of the disclosure may provide an electronic device including: a foldable housing including a folding region where the electronic device is substantially folded about a folding axis; a display panel which is visible from the outside through at least a portion of the foldable housing; and a touch panel disposed adjacent to the display panel, wherein the touch panel includes a first layer including multiple first conductive lines of which at least a portion extends in a direction parallel with the folding axis; and a second layer including multiple second conductive lines of which at least a part is elongated in a direction perpendicular to the folding axis, wherein at least one of the multiple first conductive lines, adjacent to the folding axis, has a portion formed to be away from the folding axis in the direction perpendicular to the folding axis, wherein the at least one of the multiple first conductive lines has, at the end thereof, a via for electrical connection to at least one of the multiple second conductive lines, wherein the via is formed at a position spaced at least a predetermined distance apart from the folding region, and wherein the first layer includes an opening formed in a first folding region which defines a first boundary spaced a first distance apart from the folding axis.

An electronic device according to certain embodiments of the disclosure may include a conductive line, at least a part of which is formed to extend away from the folding axis of the foldable housing, thereby preventing damage to the touch panel (e.g., digitizer panel) in the folding region.

An electronic device according to an embodiment may include a via formed at a terminal end of a conductive line at a position spaced apart from the folding axis by a designated distance, thereby preventing damage to the via hole.

An electronic device according to an embodiment may include an opening formed in a part of a first layer, thereby reducing folding stress applied to the touch panel (e.g., a digitizer).

DETAILED DESCRIPTION

Figure 1:
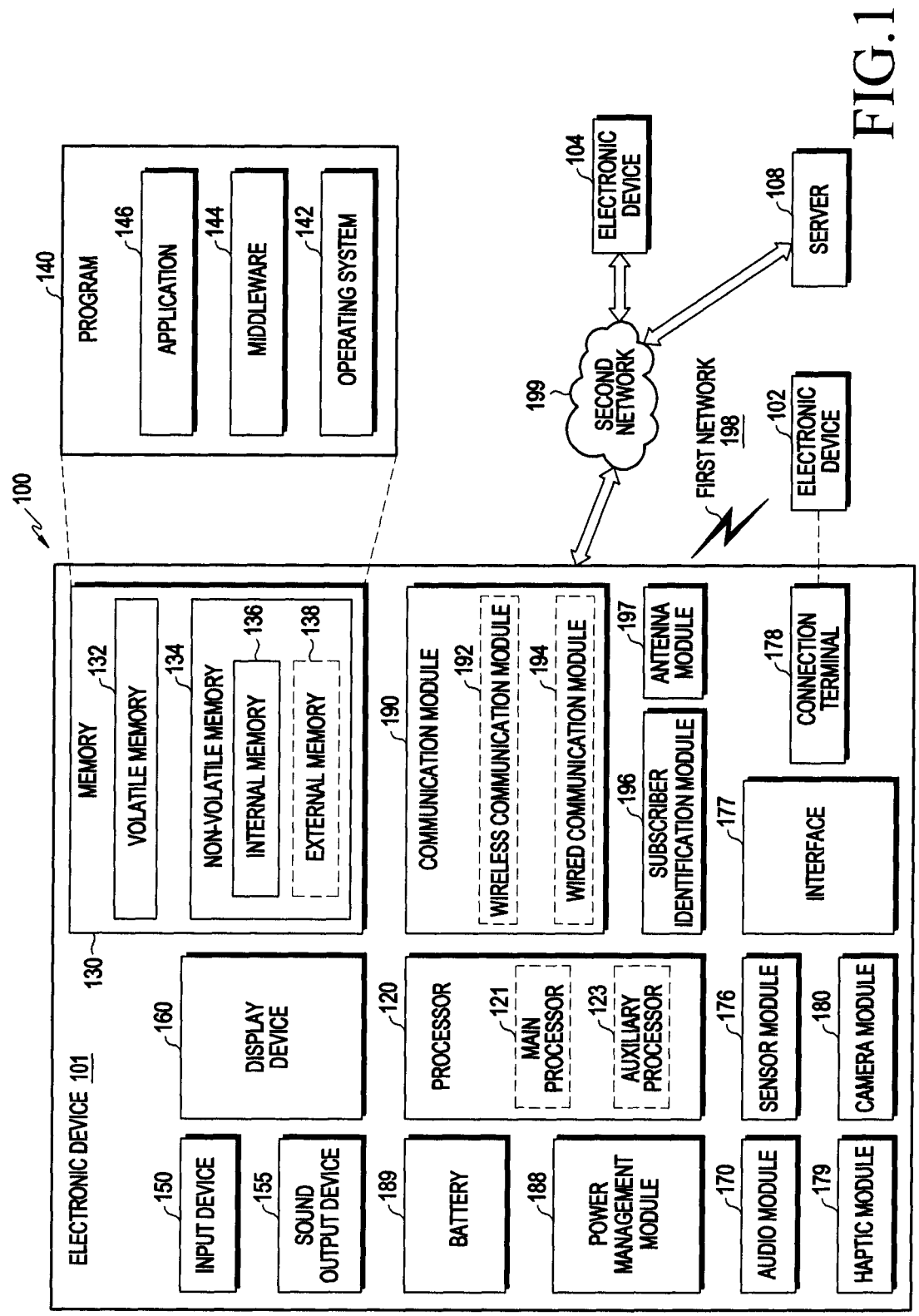
FIG. 1 is a block diagram illustrating an electronic device in a network environment according to certain embodiments of the disclosure.

FIG. 1 is a block diagram illustrating an electronic device 101 in a network environment 100 according to certain embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by a component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image and moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and support a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module may include an antenna including a radiating element implemented using a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197. At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., a program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. The term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Figure 2:
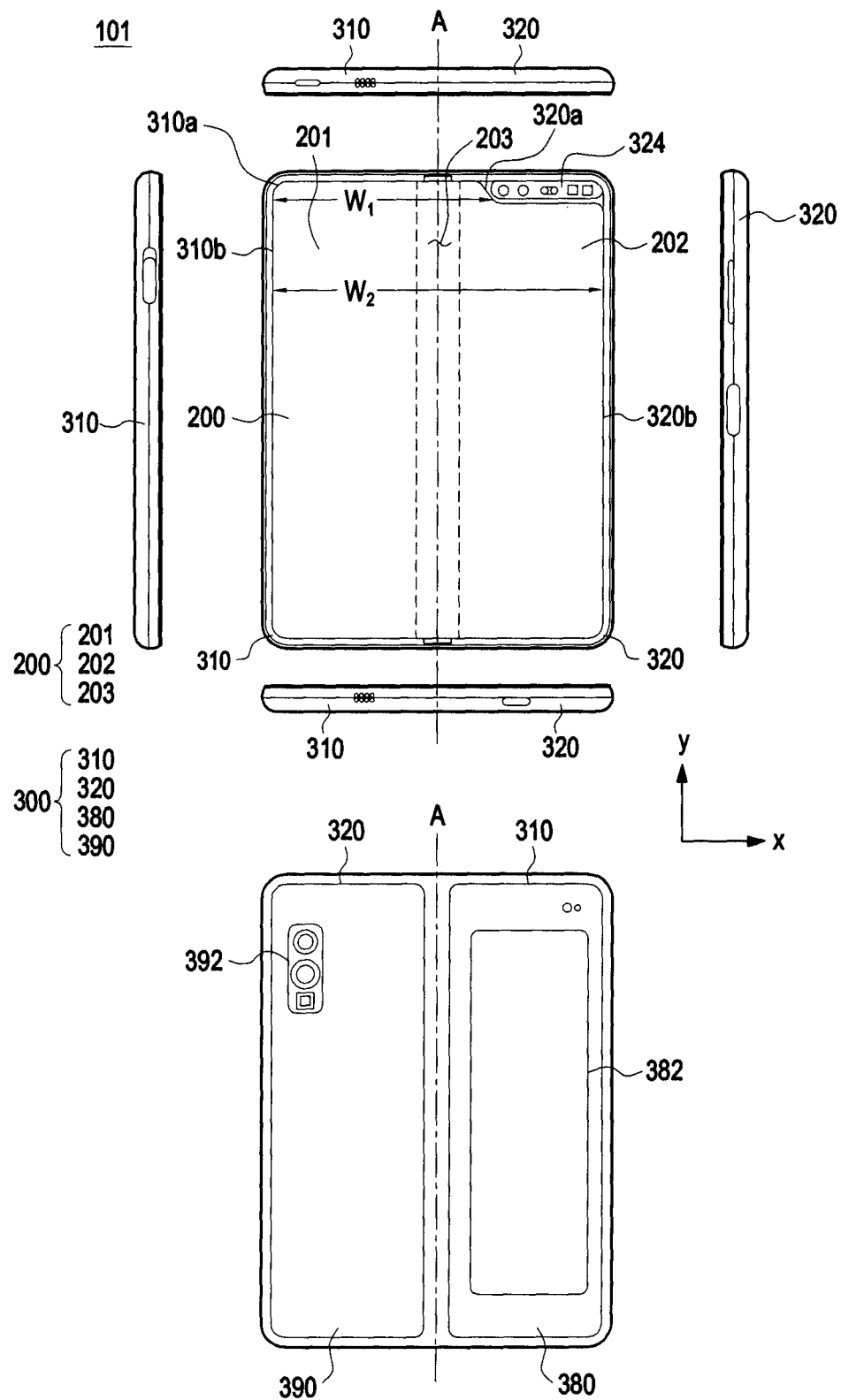
FIG. 2 is a view illustrating an unfolded state of an electronic device according to certain embodiments of the disclosure.
Figure 3:
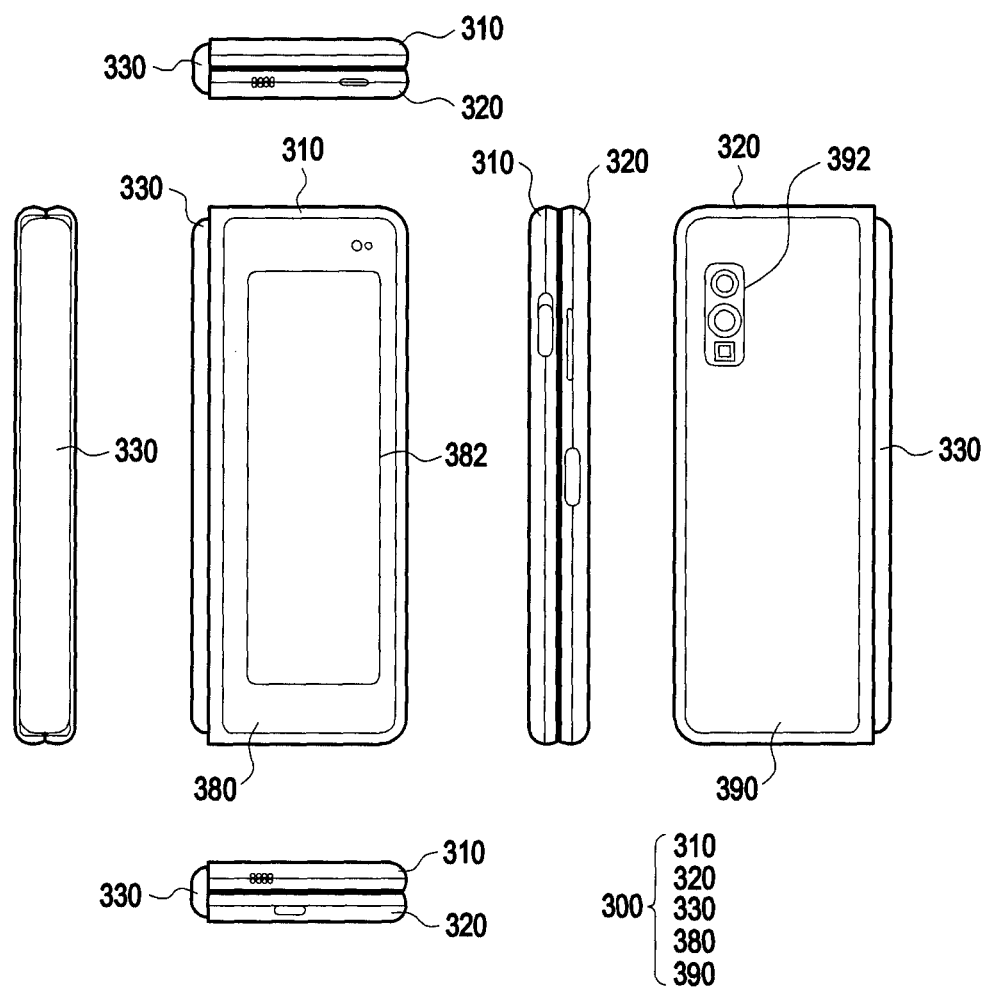
FIG. 3 is a view illustrating a folded state of an electronic device according to certain embodiments of the disclosure.

FIG. 2 is a view illustrating an unfolded state of an electronic device according to certain embodiments of the disclosure. FIG. 3 is a view illustrating a folded state of an electronic device according to certain embodiments of the disclosure.

Referring to FIG. 2 and FIG. 3, in an embodiment, an electronic device 101 may include a foldable housing 300, a hinge cover (e.g., hinge cover 330 in FIG. 3 described later) for covering a foldable part of the foldable housing 300, and a flexible or foldable display 200 (hereinafter, for short, "display" 200) (e.g., display device 160 in FIG. 1) disposed in a space formed by the foldable housing 300. According to an embodiment, the surface in which the display 200 is disposed may be defined as a front surface of the electronic device 101. The surface opposite to the front surface may be defined as a rear surface of the electronic device 101. The surface surrounding a space between the front surface and the rear surface may be defined as a lateral surface of the electronic device 101.

According to certain embodiments, the foldable housing 300 may include a first housing 310, a second housing 320 including a sensor area 324, a first rear cover 380, a second rear cover 390, and a hinge structure (e.g., hinge structure 510 in FIG. 4 described later). The foldable housing 300 of the electronic device 101 is not limited to the shape and combination shown in FIG. 2 and FIG. 3, and may be implemented by another shape or a combination and/or coupling of components. For example, in another embodiment, the first a housing structure 310 and the first rear cover 380 may be integrally formed and the second a housing 320 and the second rear cover 390 may be integrally formed.

According to certain embodiments, the first housing 310 may include a first surface (e.g., first surface 311 in FIG. 4 described later) connected to a hinge structure (e.g., hinge structure 510 in FIG. 4 described later) and facing a first direction and a second surface (e.g., second surface 312 in FIG. 4 described later) facing a second direction opposite to the first direction. The second housing 320 may include a third surface (e.g., third surface 321 in FIG. 4 described later) connected to the hinge structure 510 and facing a third direction and a fourth surface (e.g., fourth surface 322 in FIG. 4 described later) facing a fourth direction opposite to the third direction and may rotate around the hinge structure 510 (or folding axis (A-A')) with respect to the first housing 310. The electronic device 101 may be changed into a folded state or an unfolded state. The description thereof will be present below with reference to FIG. 4, FIG. 5A, and FIG. 5B. According to an embodiment, in the electronic device 101, the first surface may face the third surface in a fully folded state and the third direction may be the same as the first direction in the fully unfolded state.

According to an embodiment, the first a housing structure 310 and the second a housing structure 320 are arranged at opposite sides around a folding axis (A-A') and have generally symmetrical shapes with respect to the folding axis (A-A'). As described below, an angle and distance between the first housing 310 and the second housing 320 may vary according to whether a state of the electric device 101 is an unfolded state, a folded state, or partially unfolded (or partially folded) intermediate state. According to an embodiment, the second housing 320, unlike the first housing 310, may additionally include a sensor area 324 in which various sensors are disposed, but may have a symmetrical shape to the first housing in other areas.

According to certain embodiments, as shown in FIG. 2, the first housing 310 and the second housing 320 may together form a recess for receiving the display 200. In an embodiment, the recess may have two or more different widths in a direction perpendicular to the folding axis (A-A') due to the sensor area 324.

For example, the recess may have a first width w1 between a first portion 310a parallel with the folding axis (A-A') in the first housing 310 and a first portion 320a formed at the edge of the sensor area 324 in the second housing 320. The recess may have a second width w2 formed by a second area 310b of the first housing 310 and a second portion 320b which is parallel with the folding axis (A-A') while not corresponding to the sensor area 324 in the second housing 320. In this case, the second width w2 may be formed to be longer than the first width w1. For another embodiment, the first portion 310a of the first housing 310 and the first portion 320a of the second housing 320 which have asymmetrical shapes to each other may form a first width w1, and the second portion 310b of the first housing 310 and the second portion 320b of the second housing 320 which have symmetrical shapes to each other may form a second width w2. According to an embodiment, the first portion 320a and the second portion 320b of the second housing 320 may have different distances from the folding axis (A-A'). The width of the recess is not limited to the embodiment described above. In another embodiment, the recess may have multiple widths due to the shape of the sensor area 324 or asymmetrically shaped portions of the first housing 310 and the second housing 320.

According to certain embodiments, at least a portion of the first a housing 310 and the second a housing 320 may be formed of a metal or non-metal material having selected strength for supporting a display 200. The at least a portion formed of the metal material may provide a ground plane for the electronic device 101 and may be connected to a ground line formed on a printed circuit board (e.g., substrate part 520 in FIG. 4).

In an embodiment, the sensor area 324 may be formed to have a predetermined area proximate to one side corner of the second housing 320. However, the disposition, shape, and size of the sensor area 324 are not limited to the embodiment described above. For example, in another embodiment, the sensor area 324 may be provided to a different corner or to a predetermined area between the upper corner and the lower corner of the second housing 320. In an embodiment, various components embedded in the electronic device 101 for performing various functions may be exposed to the outside of the electronic device 101 through the sensor area 324 or at least one opening formed through the sensor area 324. In certain embodiments, the components may include various sensors. The sensors may include, for example, at least one of a front camera, a receiver, or a proximity sensor.

According to certain embodiments, the first rear cover 380 may be disposed on one side of the folding axis (A-A') on the rear surface of the electronic device 101, and have, for example, a substantially rectangular periphery, and the periphery may be surrounded by the first housing 310. Similarly, the second rear cover 390 may be disposed on the other side of the folding axis (A-A') on the rear surface of the electronic device 101, and may have a periphery surrounded by the second housing 320.

According to certain embodiments, the first rear cover 380 and the second rear cover 390 may be shaped symmetrically relative to each other with reference to the folding axis (A-A'). However, the first rear cover 380 and the second rear cover 390 do not necessarily have symmetrical shapes and in other embodiments, the electronic device 101 may include the first rear cover 380 and the second rear cover 390 having various shapes. In another embodiment, the first rear cover 380 and the first housing 310 may be integrally formed and the second rear cover 390 and the second housing 320 may be integrally formed.

According to certain embodiments, the first rear cover 380, the second rear cover 390, the first housing 310, and the second housing 320 may form a space for receiving various components (e.g., printed circuit board or battery) of the electronic device 101. According to an embodiment, one or more components may be arranged at or visually exposed through the rear surface of the electronic device 101. By way of example, at least a portion of a sub display may be visually exposed through a first rear area 382 of the first rear cover 380. By way of example, one or more of components or sensors may be visually exposed through the second rear area 392 of the second rear cover 390. In certain embodiments, the sensor may include a proximity sensor and/or a rear camera.

According to certain embodiments, the front camera exposed to the front surface of the electronic device 101 through at least one opening disposed through the sensor area 324 or the rear camera exposed through a second rear surface area 392 of the second rear cover 390 may include one or more of lenses, image sensors, and/or image signal processors. The flash may include, for example, a light emitting diode or a xenon lamp. In an embodiment, two or more lenses (infrared camera, and wide-angle or telephoto lens) and image sensors may be arranged on one surface of the electronic device 101.

Referring to FIG. 3, the hinge cover 330 may be disposed between the first housing 310 and the second housing 320 and configured to cover internal components (e.g., hinge structure 510 in FIG. 4 described later). According to an embodiment, the hinge cover 330 may be covered or exposed by a portion of the first housing 310 and the second housing 320 according to a state (unfolded state, intermediate state, or folded state) of the electronic device 101.

According to an embodiment, as shown in FIG. 2, when the electronic device 101 is disposed in an unfolded state (e.g., fully unfolded state), the hinge cover 330 may be covered by the first housing 310 and the second housing 320 not to be exposed. For another example, as shown in FIG. 3, when the electronic device 101 is in a folded state (e.g., fully folded state), the hinge cover 330 may be exposed between the first housing 310 and the second housing 320. For another example, when in the intermediate state in which the first housing 310 and the second housing 320 are folded with a certain angle, the hinge cover 330 may be partially exposed outside between the first housing 310 and the second housing 320. In this case, the exposed area may be smaller than that in the fully folded state. In an embodiment, the hinge cover 330 may include a curved surface.

According to certain embodiments, the display 200 may be disposed in a space formed by the foldable housing 300. For example, the display 200 may be seated in a recess formed by the foldable housing 300 and seen from the outside through the front surface of the electronic device 101. For example, the display 200 may occupy substantially most of the front surface of the electronic device 101. Accordingly, the front surface of the electronic device 101 may include the display 200, and a portion of the first housing 310 and a portion of the second housing 320 adjacent to the display 200. The rear surface of the electronic device 101 may include the first rear cover 380, a portion of the first housing 310 adjacent to the first rear cover 380, the second rear cover 390, and a portion of the second housing 320 adjacent to the second rear cover 390.

According to certain embodiments, the display 200 may refer to a display having an area transformable to a flat surface or a curved surface. According to an embodiment, the display 200 may include a folding region 203, a first area 201 disposed at one side (e.g., left side area of folding region 203 shown in FIG. 2), and a second area 202 disposed at the other side (e.g., right area of folding region 203 shown in FIG. 2), with reference to the folding region 203.

However, the division of areas in the display 200 of FIG. 2 is an example and the display 200 may be divided into multiple areas (e.g., two or more than four) according to the structure or function thereof. For example, in the embodiment shown in FIG. 2, the area of the display 200 may be divided by the folding axis (A-A') or the folding region 203 extending parallel with axis y, but in another embodiment, the area of the display 200 may be divided by another folding axis (e.g., folding axis parallel with axis x) or another folding region (e.g., folding region parallel with axis x).

According to an embodiment, the display 200 may be combined to or disposed adjacent to a touch panel (e.g., 210 in FIG. 6 described later) including a touch sensing circuit and a pressure sensor for measuring a strength (pressure) of a touch. For example, the display 200 may be coupled or disposed adjacent to a digitizer panel, as an example of a touch panel, for detecting a stylus pen in an electromagnetic resonance (EMR) manner.

According to certain embodiments, the first area 201 and the second area 202 may have shapes symmetrical to each other around the folding region 203. However, the second area 202, unlike the first area 201, may include a cut notch area depending on the presence of the sensor area 324, but may have a symmetrical shape to the first area 201 in areas other than the notch area. In other words, the first area 201 and the second area 202 may include parts symmetrical to each other and parts asymmetrical to each other.

Hereinafter, the operation of the first housing 310 and the second housing 320 and each area of the display 200 according to the state (e.g., folded state, unfolded state, or intermediate state) of the electronic device 101 will be described.

According to certain embodiments, when the electronic device 101 is in the unfolded state (e.g., FIG. 2), the first housing 310 and the second housing 320 may be arranged to form an angle of 180 degrees therebetween and face the same direction. The surface of the first area 201 and the surface of the second area 202 of the display 200 may form an angle of 180 degrees therebetween and face the same direction (e.g., front direction of electronic device). The folding region 203 may form the same plane with the first area 201 and the second area 202.

According to certain embodiments, when the electronic device 101 is in the folded state (e.g., FIG. 3), the first housing 310 and the second housing 320 may be arranged to face each other. The surface of the first area 201 and the surface of the second area 202 of the display 200 may form a narrow angle (e.g., 0 degrees to 10 degrees) therebetween and face to each other. At least a portion of the folding region 203 may be implemented using a curved surface having a certain curvature.

According to certain embodiments, when the electronic device 101 is in the intermediate state, the first housing 310 and the second housing 320 may be arranged at a certain angle. The surface of the first area 201 and the surface of the second area 202 of the display 200 may form an angle therebetween larger than that in the folded state and smaller than that in the unfolded state. At least a portion of the folding region 203 may be formed to be a curved surface having a certain curvature, and in this case, the curvature may be smaller than that in the folded state.

Figure 4:
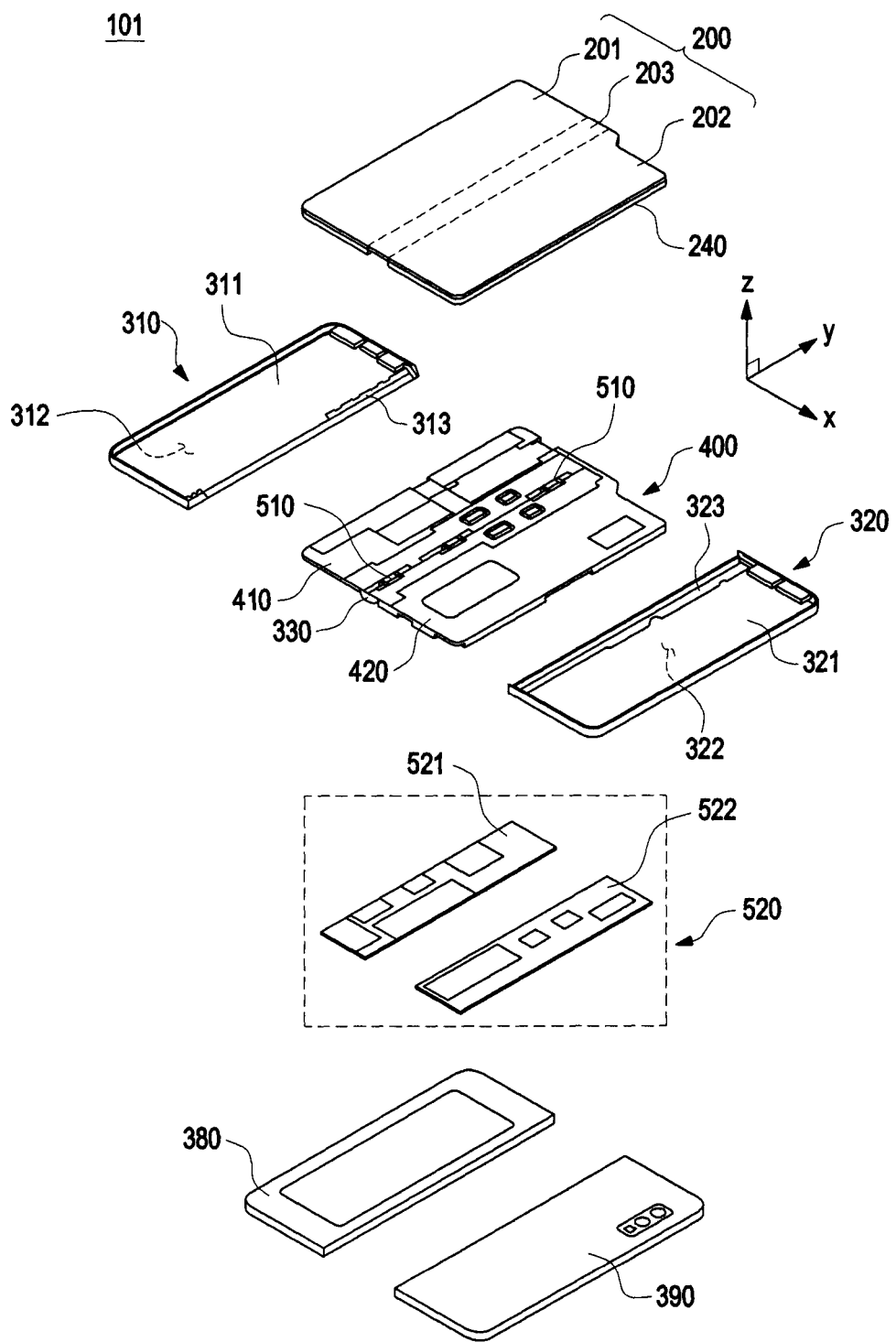
FIG. 4 is an exploded perspective view of an electronic device according to certain embodiments of the disclosure.

FIG. 4 is an exploded perspective view of an electronic device 101 according to certain embodiments of the disclosure.

Referring to FIG. 4, in certain embodiments, the electronic device 101 may include a foldable housing (e.g., foldable housing 300 in FIG. 3), a display 200, and a substrate part 520. The foldable housing may include a first housing 310, a second housing 320, a bracket assembly 400, a first rear cover 380 and a second rear cover 390, and a hinge structure 510.

According to certain embodiments, the display 200 may include a display panel (e.g., 200c in FIG. 6) (e.g., flexible display panel), at least one plate or layer (e.g., support plate 240) seated on the display panel 200c. In an embodiment, the support plate 240 may be disposed between the display panel 200c and the bracket assembly 400. An adhesive (not shown) may be disposed between the support plate 240 and the bracket assembly 400 to bond the support plate 240 to the bracket assembly 400.

According to certain embodiments, the bracket assembly 400 may include a first bracket assembly 410 and a second bracket assembly 420. The hinge structure 510 may be disposed between the first bracket assembly 410 and the second bracket assembly 420 and a hinge cover 330 may be disposed to cover the hinge structure 510 when viewing the hinge structure 510 from the outside. For another example, a printed circuit board (e.g., flexible printed circuit (FPC)) may be disposed to pass through the first bracket assembly 410 and the second bracket assembly 420.

According to certain embodiments, the substrate part 520 may include a first main circuit board 521 disposed adjacent to the first bracket assembly 410 and a second main circuit board 522 disposed adjacent to the second bracket assembly 420. The first printed circuit board 521 and the second printed circuit board 522 may be disposed in a space formed by the bracket assembly 400, the first housing 310, the second housing 320, the first rear cover 380, and the second rear cover 390. Components for implementing various functions of the electronic device 101 may be mounted on the first main printed circuit board 521 and the second main printed circuit board 522.

According to certain embodiments, the first housing 310 and the second housing 320 may be assembled to be coupled to opposite ends of the bracket assembly 400 in a state in which the bracket assembly 400 is coupled to the display 200. For example, the first housing 310 and the second housing 320 may slide from the opposite ends of the bracket assembly 400 so as to be coupled to the bracket assembly 400.

According to an embodiment, the first housing 310 may include a first surface 311 and a second surface 312 opposite to the first surface 311, and the second housing 320 may include a third surface 321 and a fourth surface 322 opposite to the third surface 321.

According to an embodiment, the first housing 310 may include a first rotation support surface 313 and the second housing 320 may include a second rotation support surface 323 corresponding to the first rotation support surface 313. The first rotation support surface 313 and the second rotation support surface 323 may each include a curved surface corresponding to the curved surface included in the hinge cover 330.

According to an embodiment, when the electronic device 101 is in an unfolded state (e.g., electronic device in FIG. 2), the first rotation support surface 313 and the second rotation support surface 323 may cover the hinge cover 330 so that the hinge cover 330 is not exposed or minimally exposed to the rear surface of the electronic device 101. For another example, when the electronic device 101 is in a folded state (e.g., electronic device in FIG. 3), the first rotation support surface 313 and the second rotation support surface 323 may rotate along the curved surface included in the hinge cover 330 so that the hinge cover 330 is fully exposed to the rear surface of the electronic device 101.

Figure 5A:
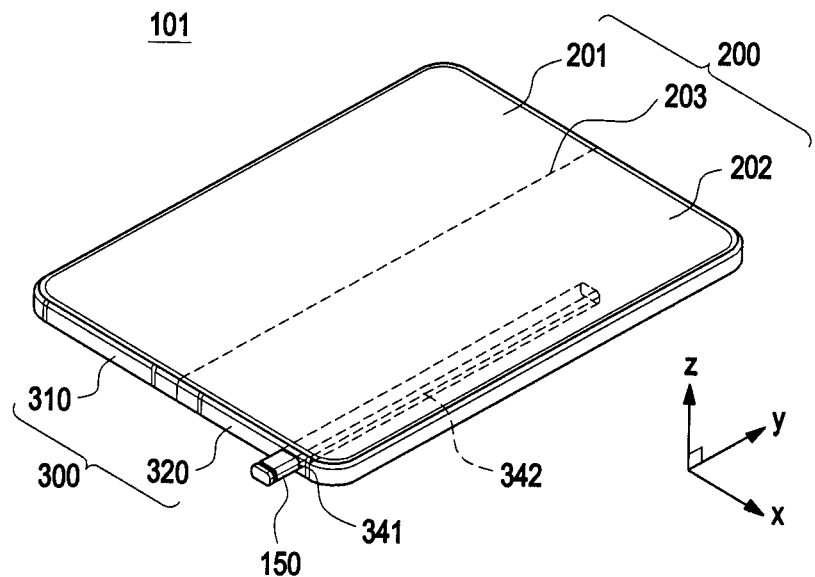
FIG. 5A is a perspective view of a fully unfolded state of an electronic device according to certain embodiments of the disclosure.

FIG. 5A is a perspective view of a fully unfolded state of an electronic device according to certain embodiments of the disclosure.

Figure 5B:
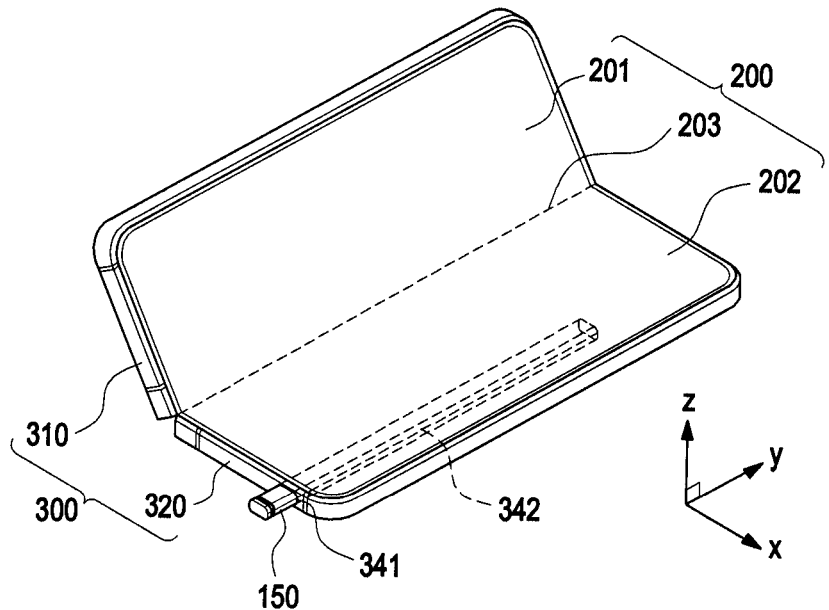
FIG. 5B is a perspective view of a partially unfolded intermediate state of an electronic device according to certain embodiments of the disclosure.

FIG. 5B is a perspective view of a partially unfolded intermediate state of an electronic device according to certain embodiments of the disclosure.

In detail, FIG. 5A may show the unfolded state of the electronic device 101, and the FIG. 5B may show the folded state of the electronic device 101.

Referring to FIG. 5A to 5B, the electronic device 101 may include a foldable housing 300 and a flexible display 200. The electronic device 101 may be variable disposed into either the folded state or the unfolded state. When viewed from a hinge axis (e.g., a direction parallel with y axis) direction, the electronic device 101 may be folded in two ways. One way is "in-folding" in which the front surface of the electronic device 101 is folded to form an acute angle, and the other way is "out-folding" in which the front surface of the electronic device 101 is folded to form an obtuse angle. For example, when the electronic device 101 is set in the folded state via in-folding, the first surface (e.g., 311 in FIG. 4) may face the third surface (e.g., 321 in FIG. 4), and in the unfolded state, the third direction may be the same as the first direction (e.g., the first and third surfaces face a same direction, and form a common plane). For another example, when the electronic device 101 is in the folded state via out-folding, the second surface (e.g., 312 in FIG. 4) may face the fourth surface (e.g., 322 in FIG. 4) (e.g., the opening angle exceeds the flat 180 degrees).

In addition, the electronic device 101 may include, although not shown, multiple hinge axes (e.g., two parallel hinge axes including axis A and another axis parallel with axis A in FIG. 2). In this case, the electronic device 101 may be folded in a "multi-folding" way in which the in-folding way and the out-folding way are combined.

The in-folding way may refer to a state in which the display 200 is not exposed to the outside in the fully folded state. The out-folding way may refer to a state in which the display 200 is exposed to the outside in the fully folded state.

FIG. 5B shows that the electronic device 101 is in the intermediate state during an in-folding process.

Hereinafter, for convenience, the description will be made on the basis of the state in which the electronic device 101 is folded in the in-folding way, but it should be noted that the description may be applied with modification to the state in which the electronic device 101 is folded in the out-folding way.

According to certain embodiments, the flexible display 200 may have a square shape with rounded corners, in which a bezel area is exceedingly narrow.

The flexible display 200 may include a first area 201 disposed on the first housing 310 and a second area 202 disposed on the second housing 320 and the first area 201 and the second area 202 may be implemented in the same shape. The first area 201 and the second area 202 of the electronic device 101 may be demarcated around the folding region 203.

The other components of the electronic device 101 in FIG. 5A and FIG. 5B may employ the feature of the electronic device 101 in FIG. 1 to FIG. 4.

A user may perform input on the first area 201 or the second area 202 shown in FIG. 5A and FIG. 5B by using a portion of the human body (e.g., hand) or by using an input device 150.

Referring to FIGS. 5A and 5B, the electronic device 101 may include a hole 341 in a portion of the foldable housing 300, such as a portion of the lateral side of the housing 300. According to certain embodiments, the foldable housing 300 may further include a reception space 342 accessible through the hole 341, and the input device 150 (e.g., stylus pen) may be inserted into the electronic device 101 through the reception space 342 to be stowed within the foldable housing 300.

Figure 6A:
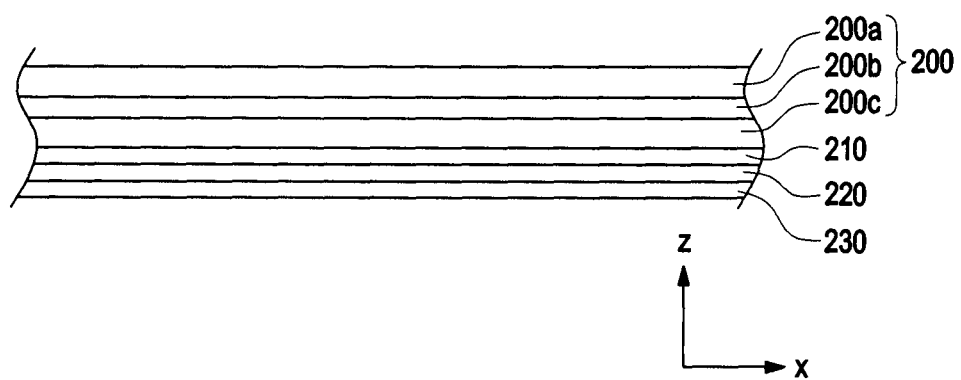
FIG. 6A is a cross-sectional view illustrating a fully unfolded state or a partially unfolded intermediate state of a display part of an electronic device according to an embodiment.
Figure 6B:
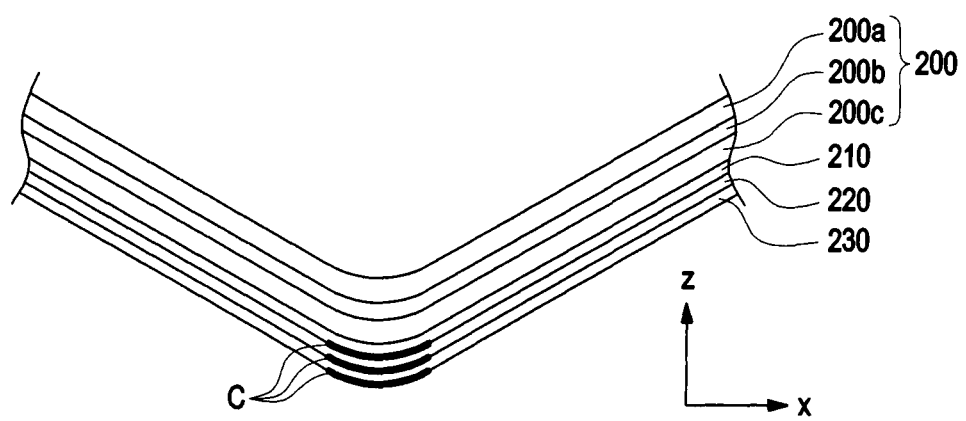
FIG. 6B is a cross-sectional view illustrating a partially unfolded intermediate state of a display part of an electronic device according to an embodiment.

FIG. 6A is a cross-sectional view illustrating a fully unfolded state or a partially unfolded intermediate state of a display part of an electronic device according to an embodiment. FIG. 6B is a cross-sectional view illustrating a partially unfolded intermediate state of a display part of an electronic device according to an embodiment.

The display part of the electronic device 101 may include components for displaying a screen through a display and components connected to the display so as to integrally move with the display. Referring to FIG. 6A, the display part may include a display panel 200c and a touch panel 210 disposed adjacent to the display panel 200c.

According to an embodiment, a display 200 may include a display panel 200c and further include a polarization layer 200b disposed on the display panel 200c and a window member 200a forming an appearance of the display. The display panel 200c, the polarization layer 200b, and the window member 200a may form one display 200 and may be formed of a flexible material. Accordingly, as shown in FIG. 6a, the display 200 may be curved as shown in FIG. 6B when an external force is applied thereto.

The electronic device 101 may detect an input (e.g., user's input or input through input device 150 in FIG. 5A) on the surface of the display 200 by using a touch panel 210. In here, the detectable input on the touch panel 210 may include an input through hovering as well as an input through a direct contact to the surface of the display 200. According to an embodiment, the touch panel 210 may be formed in substantially the same area as the display 200 and disposed adjacent to the display 200. According to certain embodiments, the touch panel 210 may be disposed on the upper surface or the lower surface of the display 200. For example, FIG. 6A and FIG. 6B show that the touch panel 210 is disposed on the rear surface of the display 200. In the description below, the case in which the touch panel 210 is disposed on the rear surface of the display 200 will be shown on the basis of FIG. 6A and FIG. 6b, but it should be noted that the configuration is not necessarily limited thereto.

According to an embodiment, the display 200 may be formed of a material to allow a radio wave or a magnetic field to partially penetrate therethrough. The display 200 may include the display panel 200c and/or the touch panel 210 mounted thereon. Accordingly, the display 200 may be used as not only an output device for outputting a screen but also an input device with a touch screen function. The display panel 200c may include a display element layer including at least one pixel and a TFT layer connected to the display element layer. According to certain embodiments, the display panel 200c may correspond to a panel such as an LCD, an LED, and an AMOLED, and the electronic device 101 may display various images according to various operations, applications executions, contents, and the like.

According to certain embodiments, the touch panel 210 may include various types of touch panels. For example, various types of touch panels such as a capacitive touch panel for detecting a change in capacitance, a pressing-type touch panel for detecting a position by detecting the pressure applied on a panel, an optical touch panel using infrared rays, and a transparent electrode type touch panel using a contact point of a transparent conductive film may be used. In addition, although not mentioned above, various types of touch panels for detecting an input position, such as an electromagnetic resonance (hereinafter, referred to as EMR) type touch panel, may be used.

According to an embodiment, the touch panel 210 may be formed in substantially the same area as the display 200 and used by being attached to the display 200. For example, when the digitizer panel is used as the touch panel 210, the digitizer panel may include a pattern layer having a transmission pattern formed thereon and a pattern layer (e.g., Tx pattern) having a reception pattern (e.g., Rx pattern) formed thereon, and the transmission pattern layer and the reception pattern layer are stacked on each other to perform a function of generation and detection of an electromagnetic field. According to an embodiment, a magnetic field generated by an electromagnetic inducer (input device, for example, stylus pen) may be detected by using the digitizer panel through an electromagnetic resonance (hereinafter, referred to as EMR) method and various motions of the electromagnetic inducer, such as approach, click, and drag, and the like may be detected.

According to certain embodiments, the display part may further include a magnetic shield member 220 and a protection member 230 on the rear surface of the touch panel 210. According to an embodiment, the magnetic shield member 220 may be disposed on the rear surface of the touch panel 210. The magnetic shield member 220 may be formed by applying, for example, a magnetic metal powder (MMP) onto the rear surface of the touch panel 210. The magnetic shield member 220 may block magnetism of peripheral components (e.g., other electronic components in foldable housing 300), which may be identified as a noise, other than an input signal input by the stylus pen.

According to an embodiment, the protection member 230 may be disposed on the rear surface of the touch panel 210. The protection member 230 may be formed of one of at least one adhesion layer, at least one cushion layer, and at least one heat radiation layer, or a combination of at least two of the at least one adhesion layer, the at least one cushion layer, and the at least one heat radiation layer. In here, the at least one cushion layer may have components in which an embo pattern is formed to absorb a physical impact applied to the panel. Here, the at least one heat radiation layer may include a component for emitting heat generated by the display panel 200c and/or the touch panel 210, and include a metal material (e.g., graphite+copper (CU) foil), for example, in at least a portion thereof.

According to an embodiment, the magnetic shield member 220 and/or the protection member 230 like the touch panel 210 may be formed in substantially the same area as the display 200c and disposed adjacent to the display 200c.

In embodiments described above, when the display 200 is a flexible display, the touch panel 210, the magnetic shield member 220, and/or the protection member 230 may be susceptible to physical impact or application of external force. Accordingly, a bending portion C of the touch panel 210, the magnetic shield member 220, and/or the protection member 230 disposed in the folding region of the display 200 may undergo various types of damage (e.g., cracking, rupture) after sufficient use and movement.

Figure 7:
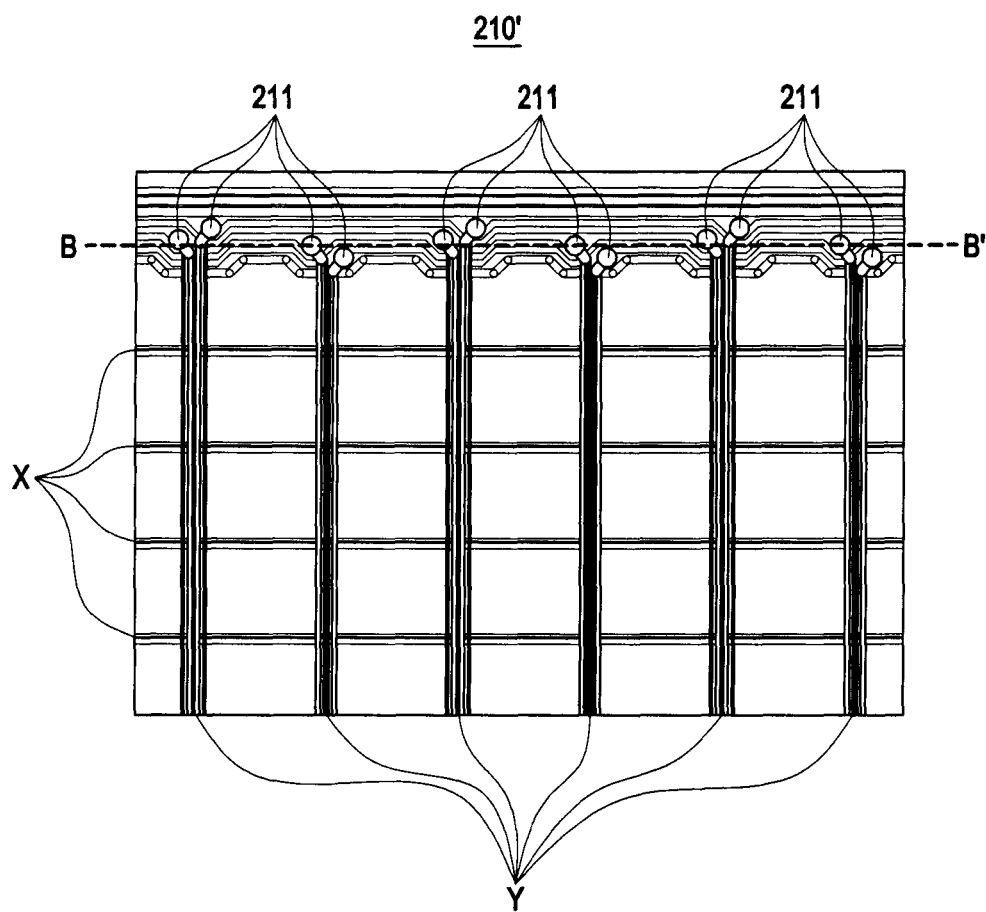
FIG. 7 is a view illustrating a touch panel having multiple first conductive lines and multiple second conductive lines formed therein according to an embodiment of the disclosure.
Figure 8:
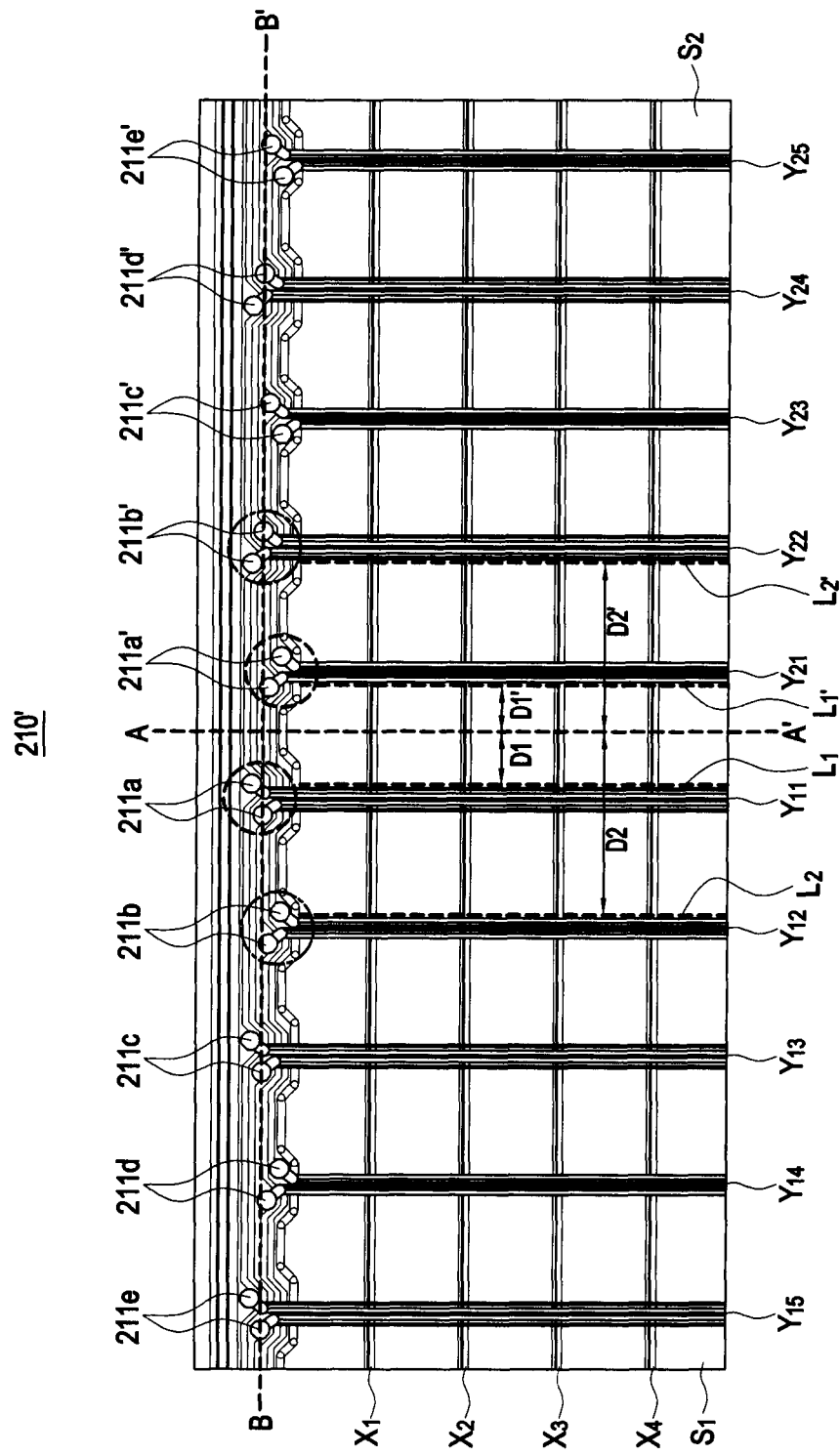
FIG. 8 is a view illustrating a touch panel having at least a portion of via hole formed in a folding region according to an embodiment of the disclosure.

FIG. 7 is a view illustrating a touch panel 210' having multiple first conductive lines and multiple second conductive lines formed therein according to an embodiment of the disclosure. FIG. 8 is a view illustrating a touch panel 210' having at least a portion of via hole 211 formed in a folding region (e.g., folding region 203 in FIG. 2) according to an embodiment.

Referring to FIG. 7, the touch panel 210' may include multiple first conductive lines and multiple second conductive lines.

According to certain embodiments, at least a portion of the multiple first conductive lines is extended and elongated toward a fifth direction. In here, the fifth direction may be parallel with a longitudinal direction of the electronic device. According to an embodiment, the multiple first conductive lines formed in the fifth direction may be a pattern for showing axis Y of the touch panel 210'. For convenience of description, the multiple first conductive lines are indicated using symbol Y.

According to certain embodiments, at least a portion of the multiple second conductive lines is extended and elongated toward a sixth direction. In here, the sixth direction may be parallel with a widthwise direction of the electronic device. According to an embodiment, the multiple second conductive lines formed in the sixth direction may be a pattern for showing axis X of the touch panel 210'. For convenience of description, the multiple second conductive lines are indicated using symbol X.

An XY coordinate system of the touch panel 210' may be formed by using the multiple first conductive lines Y and the multiple second conductive lines X. According to an embodiment, a transmission pattern (e.g., Tx pattern) and a reception pattern (e.g., Rx pattern) may be formed by the combination thereof. For example, when a digitizer panel is applied as the touch panel 210', the touch panel 210' may perform a function of generation and detection of an electromagnetic field.

Referring to FIG. 7 and FIG. 8 together, the touch panel 210' including the multiple first conductive lines may include a via formed at an end of at least one of the multiple first conductive lines for electrical connection to the multiple second conductive lines. According to an embodiment, the via may be formed by filling a via hole 211 formed at the touch panel 210' with a conductive material (e.g., conductive material 215 in FIG. 9 and FIG. 10 described later).

In the description hereinafter, the position of the via may be identical to the position of the via hole 211. According to certain embodiments, the formation of the via hole 211 at the touch panel may refer to the formation of the conductive via at the position at which the via hole 211 is formed.

In FIG. 7 and FIG. 8, the via holes 211 are illustrated as formed at each of ends of the multiple first conductive lines, but is not limited thereto. In addition, although not shown in the figures, a via may be formed at an end of at least one of multiple second conductive lines passing through FIG. 7 and FIG. 8.

Referring to FIG. 8, at least one of the via holes 211 formed at the end of at least one of the multiple second conductive lines may be positioned in a folding region (e.g., folding region 203 in FIG. 2) of a foldable housing (e.g., foldable housing 300 in FIG. 2) or at a position adjacent to the folding region.

For example, the multiple first conductive lines may include a (1-1)th conductive line Y11 or Y21, a (1-2)th conductive line Y12 or Y22, and a (1-3)th conductive line Y13 or Y23 formed parallel with each other in a direction away from the folding axis (e.g., folding axis (A-A') in FIG. 2). In addition, a first via hole 211a or 211a' may be formed at the end of the (1-1)th conductive line Y11 or Y12, a second via hole 211b or 211b' at the end of the (1-2)th conductive line Y12 or Y22, and a third via hole 211c or 211c' at the end of the (1-3)th conductive lines Y13 or Y23. Furthermore, more conductive lines ((1-4)th, (1-5)th, . . . ) and more via holes (fourth via hole, fifth via hole, . . . ) may be formed.

According to certain embodiments, first boundaries L1 and L1' may be formed at two different positions spaced a first distance D1 or D1' apart from the folding axis (A-A') to one side and the other side, respectively and second boundaries L2 and L2' at two different positions spaced a second distance D2 or D2' longer than the first distance D1 or D1' apart from the folding axis (e.g., folding axis (A-A') in FIG. 2), respectively. According to an embodiment, the first boundaries L1 and L1' may include a (1-1)th boundary L1 positioned at one side (e.g., left side) of the folding axis (A-A') and a (1-2)th boundary L1' positioned at the other side (e.g., right side) of the folding axis (A-A'). According to an embodiment, the second boundaries L2 and L2' may include a (2-1)th boundary L2 positioned at one side (e.g., left side) of the folding axis (A-A') and a (2-2)th boundary L2' positioned at the other side (e.g., right side) of the folding axis (A-A').

According to certain embodiments, the folding region may include a first folding region (e.g., first folding region R1 in FIG. 12 described later) formed between the first boundaries L1 and L1' positioned at two different positions. In addition, the folding region may include a second folding region (e.g., second folding region R2 in FIG. 12 described later) formed between the first boundary L1 and the second boundary L2 (or between the first boundary L1' and the second boundary L2'). The second folding region may be formed between the first boundaries L1 and L1' and the second boundaries L2 and L2' formed at both sides of the folding axis. To summarize the above, the first folding region (e.g., first folding region R1 in FIG. 12 described later) may be defined through the first boundaries L1 and L1' spaced the first distance D1 or D1' apart from the folding axis (A-A') and the second folding region (e.g., second folding region R2 in FIG. 12 described later) may be defined through the first boundaries L1 and L1' and the second boundaries L2 and L2' spaced the second distance D2 or D2' apart from the folding axis (A-A'). According to an embodiment, the second folding region may be formed on both sides (one side and the other side) of the touch panel 210' with reference to the first folding region.

When the foldable housing (e.g., foldable housing 300 in FIG. 2) is in the midst of a folding operation, the first folding region may indicate a portion in which the largest degree of folding stress occurs (e.g., that is, the portion most susceptible to damage) and the second folding region may indicate a portion which undergoes less folding stress but where continuous stress is nonetheless applied to nearby components (e.g., touch panel 210') included in the foldable housing 300 based on repeated folding operations. For example, the first distance D1 or D1' forming the first boundaries L1 and L1' of the first folding region may be 1.5 mm, and accordingly the first folding region may have a width of 3 mm to a left and right, with reference to the folding axis (e.g., folding axis (A-A') in FIG. 2). For example, the second distance D2 or D2' forming the second boundaries L2 and L2' of the second folding region may be 3.75 mm, and the second folding region according to an embodiment may include two folding regions having a width of 2.25 mm at a left and right sides with reference to the first folding region. However, the first folding region and the second folding region are not limited thereto. For example, the distance D1 and the distance D1' configured to form the first boundaries L1 and L1' of the first folding region may be formed in different widths and the distance D2 and the distance D2' configured to form the second boundaries L2 and L2' of the second folding region may be formed in different widths. The boundaries of the first folding region and the second folding region may be variously changed depending on various elements such as the size of the electronic device, the arrangement of the internal components of the electronic device, and the curvature R of a flexible display part included in the electronic device.

Referring to FIG. 8, the first via hole 211a or 211a' is illustrated as disposed adjacent to the first folding region (or on the first boundary L1 or L1') and the second via hole 211b or 211b' may be shown to be disposed adjacent to the second folding region (or on the second boundary L2 or L2'). The via holes 211a, 211a', 211b, and 211b' may be relatively susceptible to deformation from a structural point of view compared to other components (e.g., conductive line) of the touch panel 210'. Therefore, when the foldable housing 300 is folded more than a certain number of times, the damage (e.g., cracking) caused thereby to the via holes 211a, 211a', 211b, and 211b' may easily occur. This may degrade the touch recognition ratio of an input device and may cause an error in an operation of the electronic device in response to the input of the input device.

Figure 9:
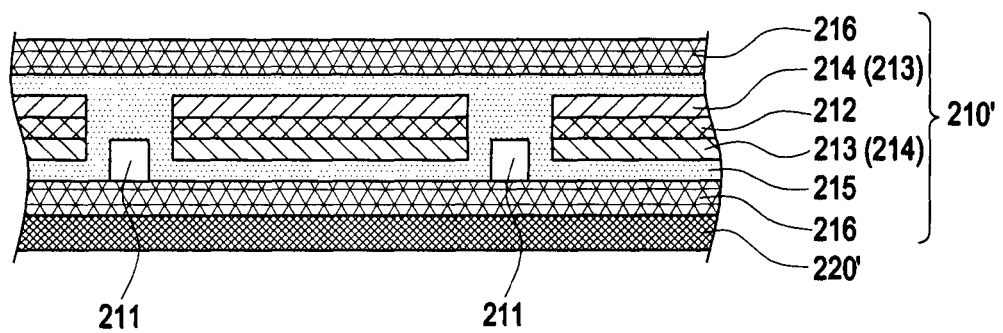
FIG. 9 is a cross-sectional view illustrating a touch panel and a magnetic shield member according to an embodiment of the disclosure.
Figure 10:
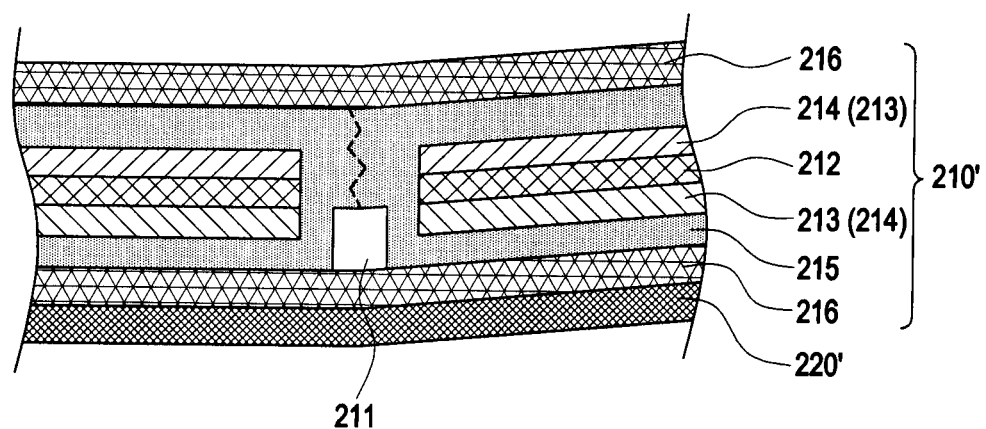
FIG. 10 is a cross-sectional view illustrating a touch panel and a magnetic shield member when folded according to an embodiment of the disclosure.

FIG. 9 is a cross-sectional view illustrating a touch panel 210' and a magnetic shield member 220' according to an embodiment of the disclosure. FIG. 10 is a cross-sectional view illustrating a touch panel 210' and a magnetic shield member 220' when folded according to an embodiment of the disclosure. FIG. 9 and FIG. 10 is a brief view illustrating a configuration of the cross-section of the touch panel 210' according to the embodiment shown in FIG. 7 or FIG. 8, taken along B-B' direction.

With respect to the cross-sectional surface of the touch panel 210' as illustrated through FIG. 9 and FIG. 10, the touch panel 210 according to certain embodiments may include a first layer 213, a second layer 214, a base layer 212 between the first layer 213 and the second layer 214, and a conductive material 215 formed to surround at least a portion of the first layer 213 or at least a portion of the second layer 214, and configured to form a via hole.

As shown above, the multiple first conductive lines Y and the multiple second conductive lines X may be formed on different layers. According to an embodiment of the disclosure, the multiple first conductive lines Y may be formed on the first layer 213 and the multiple second conductive lines X may be formed on the second layer 214. According to another embodiment of the disclosure, the multiple first conductive lines Y may be formed on the second layer 214 and the multiple second conductive lines X may be formed on the first layer 213. Hereinafter, for simplicity of description, this particular description will center on an embodiment in which the multiple first conductive lines Y are formed on the first layer 213 and the multiple second conductive lines X are formed on the second layer 214. However, it should be understood the disclosure is not limited thereto.

In FIG. 9 and FIG. 10, as an embodiment, the second layer 214 is illustrated to be disposed on the base layer 212 and the first layer 213 is illustrated to be disposed under the base layer 212. However, contrary to the case above, as indicated in parentheses in FIG. 9 and FIG. 10, the first layer 213 may be disposed on the base layer 212 and the second layer may be disposed under the base layer 212. Hereinafter, for simplicity of description, it will be described based on that the second layer 214 is disposed on the base layer 212 and the first layer 213 is disposed under the base layer 212. Again, it should be understood the disclosure is not limited thereto.

The base layer 212 may be polyimide (PI) or a flexible copper clad laminate in which an electrically conductive material (e.g., copper alloy) is formed on the outside of polyimide (PI). According to an embodiment, a double-sided flexible printed circuit board (FPCB) structure may be formed by patterning the first layer 213 and the second layer 214 on each side of the base layer 212. The conductive material 215 may be additionally formed on the double-sided FPCB in which both sides are patterned.

According to an embodiment, the touch panel 210' may be stacked on at least one surface of the conductive material and may further include an insulation layer 216 configured to insulate at least a portion of the conductive material. The insulation layer 216 may correspond to, for example, a "coverlay." Types of the coverlay may include a black coverlay as well as a colored coverlay (e.g., yellow), without any limitation thereto.

A magnetic shield member 220' may be further included, disposed on the rear surface of the touch panel 210' and the description thereof will be given below in detail referring to FIG. 21 to FIG. 24b.

In double-sided FPCB structure, the conductive material 215 may be provided for forming a via hole (e.g., 211 in FIG. 7 and FIG. 8). The conductive material 215 may be formed by, for example, copper (Cu) or a copper (Cu) alloy and plated on the surface of the double-sided FPCB structure through various methods. The via hole 211 configured to electrically connect conductive lines separated into multiple layers to each other may be formed through the conductive material 215.

According to an embodiment, the conductive via, which is configured to electrically connect conductive lines arranged on multiple layers, may include a via hole 211 formed through the conductive material 215 and then filling the via hole 211 with another conductive material. In this case, the conductive material filling the via hole may be formed of a same material as the conductive material 215, or using a different material.

In an embodiment, the via hole 211 and the conductive material 215 configured to form the via hole 211 may undergo, for example, cracking shown in FIG. 10 upon folding.

Figure 11:
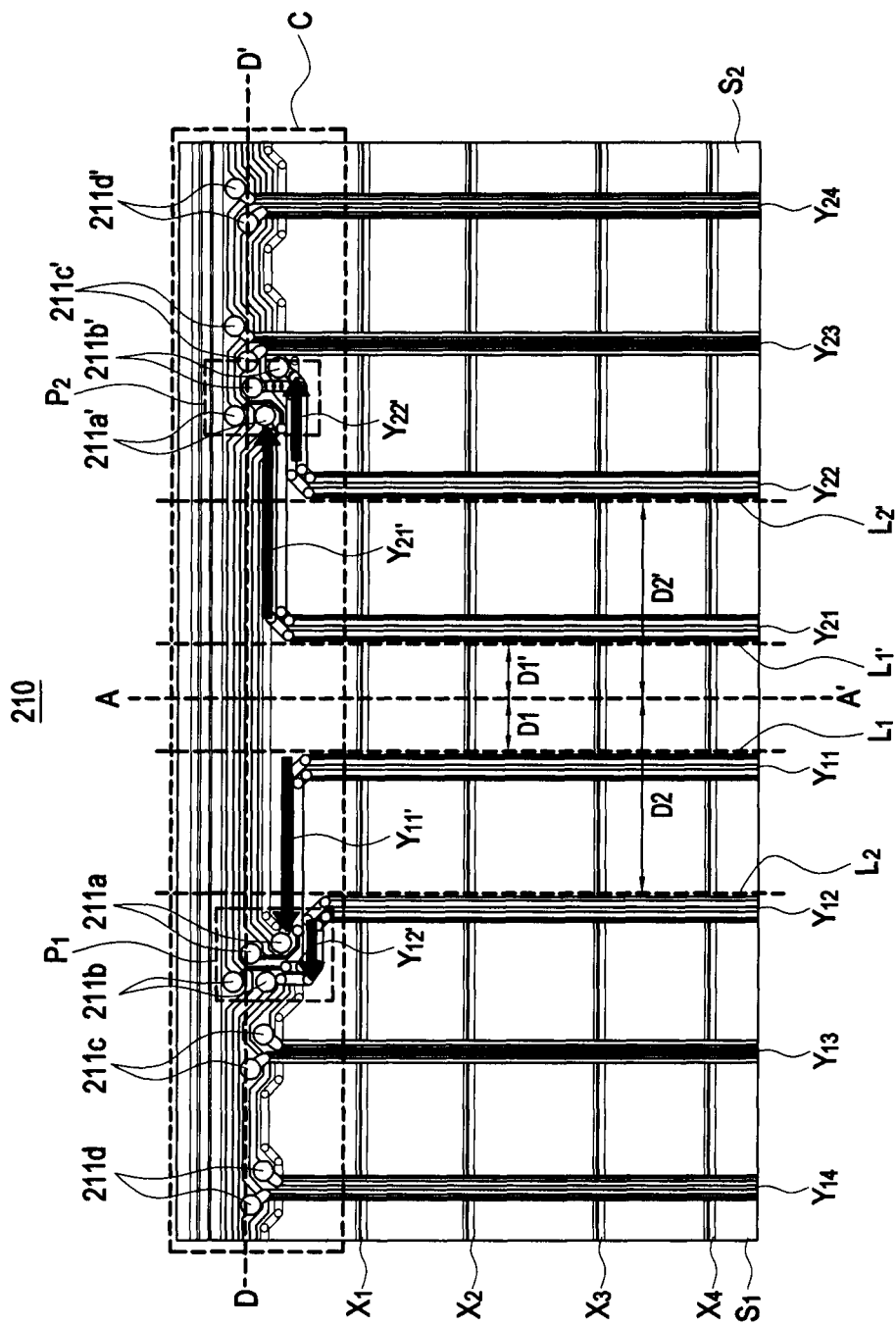
FIG. 11 is a view illustrating a touch panel having a via disposed outside a folding region according to certain embodiments of the disclosure.

FIG. 11 is a view illustrating a touch panel 210 having a via disposed outside a folding region according to certain embodiments of the disclosure.

Through the embodiment of FIG. 11, it is possible to provide the touch panel structure 210 capable of solving the problem that may occur to the touch panel 210' described with reference to FIG. 7 to FIG. 8.

According to certain embodiments of the disclosure, a part of at least one of the multiple first conductive lines may face a direction different from the fifth direction (e.g., longitudinal direction of touch panel 210 or direction parallel with folding axis) and spaced away from the folding axis. FIG. 11 shows, as an embodiment, a configuration in which portions Y11', Y12', Y21', and Y22' of two conductive lines Y11, Y12, Y21, and Y22 each in the left and right sides (first area S1, second area S2) with reference to the folding axis (A-A') among the multiple first conductive lines (e.g., Y11, Y12, Y13, Y14, . . . , Y21, Y22, Y23, Y24, . . . ) are bent to extend in a direction (e.g., width direction of touch panel 210 or direction perpendicular to folding axis) different from the fifth direction.

According to certain embodiments, a via, disposed in the folding region, among vias formed at the end of at least one of the multiple first conductive lines and/or a via disposed at a position adjacent to the folding region may be formed at positions spaced a predetermined distance from the folding region. FIG. 11 shows that via holes 211a, 211b, 211a', and 211b' formed at ends of some of the multiple first conductive lines (e.g., Y11, Y12, Y21, and Y21) are formed at positions P1 and P2 spaced a predetermined distance from the folding axis (A-A').

According to an embodiment, (1-1)th conductive lines Y11 and Y21 may be formed in the folding region and/or at positions adjacent to the folding region and the portions Y11' and Y21' of the (1-1)th conductive lines Y11 and Y21 extend in a direction away from the folding axis (A-A') so that the first vias 211a and 211a' are spaced a predetermined distance from the folding region. According to an embodiment, (1-2)th conductive lines Y12 and Y22 may be formed in the folding region and/or at positions adjacent to the folding region and the portions Y12' and Y22' of the (1-2)th conductive lines Y12 and Y22 extend in a direction away from the folding axis (A-A') so that the second vias 211b and 211b' are spaced a predetermined distance from the folding region. Here, the first via 211a or 211a' and the second via 211b or 211b' may be formed at positions farther than a portion in which the (1-2)th conductive line Y12 or Y22 is parallel with the folding axis (A-A'), from the folding axis (A-A').

As shown in FIG. 11, when the via holes are spaced by a predetermined distance apart from the folding axis (A-A'), the stress applied to the via and via hole from repeated folding operations of the foldable housing (e.g., foldable housing 300 in FIG. 2) may be reduced.

According to an embodiment, the multiple first conductive lines (e.g., Y11', Y12', Y21', and Y22') facing a direction different from the fifth direction and extending to be spaced apart from the folding axis (A-A') may be formed in a non-display area C (e.g., BM area). The non-display area C may be a portion formed at least a portion of the edge (e.g., periphery) of the display. For example, as a circuit board part or a signal transmission line according to a touch integrated circuit (IC) of the touch panel 210 is disposed at the edge (e.g., periphery) of at least a portion of a display area (or active area), the non-display area C may be formed to shield the same from being viewed. The non-display area C may be formed to be opaque through, for example, printing or coating. When the multiple first conductive lines (e.g., Y11', Y12', Y21', and Y22') are formed in a curved portion in the display area, input recognition errors may occur. Thus, in order to prevent this problem, the multiple first conductive lines may be arranged in the non-display area.

Figure 12:
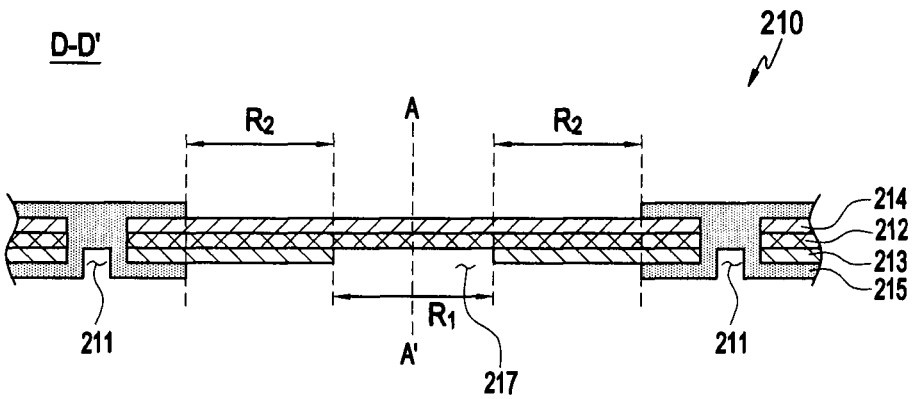
FIG. 12 is a cross-sectional view illustrating a touch panel having an opening formed in a first folding region and a conductive material disposed at an edge of a first folding region and a second folding region according to certain embodiments of the disclosure.
Figure 13:
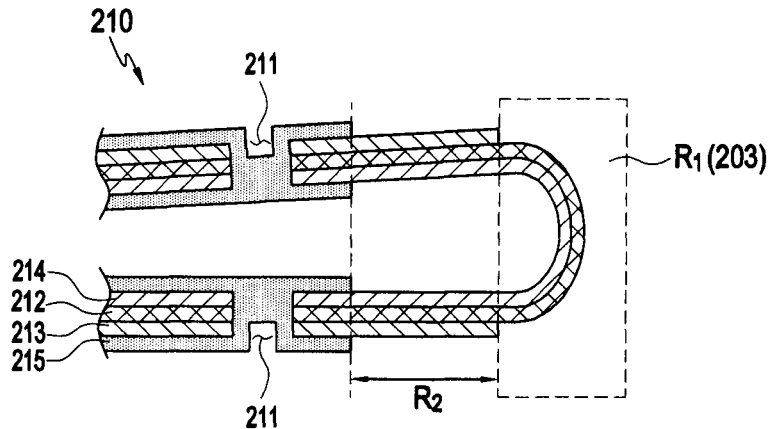
FIG. 13 is a cross-sectional view illustrating a folded state of the touch panel of FIG. 12.

FIG. 12 is a cross-sectional view illustrating a touch panel 210 including an opening 217 formed on a first folding region R1 and a conductive material disposed at an edge of a first folding region R1 and a second folding region R2 according to certain embodiments of the disclosure. FIG. 13 is a cross-sectional view illustrating a folded state of the touch panel 210 according to an embodiment of FIG. 12. FIG. 12 is a brief view illustrating a configuration of the cross-section of the digitizer panel according to the embodiment shown in FIG. 11, taken along D-D' direction.

The folding region R1 shown in FIG. 12, according to an embodiment, may be identical to the first folding region defined by the first boundaries L1 and L1' of FIG. 8 (or FIG. 11) and the second folding region R2 may be identical to the second folding region defined by the first boundaries L1 and L1' the second boundaries L1 and L1' of FIG. 8 (or FIG. 11). However, the configuration is not necessarily limited thereto and the first folding region R1 and the second folding region R2 may respectively refer to other regions other than the first folding region of FIG. 8 (or FIG. 11) and the second folding region.

Referring to FIG. 12, in an electronic device according to an embodiment, a first layer 213 may include an opening 217 at a position corresponding to the position of the first folding region R1 to reduce the stress applied to a touch panel 210. In other words, in the embodiment in which the first layer 213, the base layer 212, and the second layer 214 are sequentially stacked, the first layer 213 may not form a stacked structure with the base layer 212 and the second layer 214 at a position corresponding to the first folding region R1. In other words, conductive lines (e.g., multiple first conductive lines formed on first layer 213) may be omitted from patterning on the base layer 212 at a position corresponding to the first folding region R1. When the first layer 213 includes the opening 217 at a position corresponding to the first folding region R1, the touch panel 210 may include a substantial single-sided FPCB shape at the first folding region R1 to which folding stress is maximally applied. The single-sided FPCB may refer to a configuration in which a conductive line is formed on one surface of the base layer 212.

According to certain embodiments, in the second folding region to which folding stress is applied but less than that of the first folding region, it is possible to selectively employ a single or double-sided FPCB depending on the design specifications of an electronic device.

When the touch panel 210 is folded, the touch panel 210 having a double-sided FPCB shape may have a risk of damage in each of the double-sided patterning formed on the FPCB, but as shown in FIG. 12 and FIG. 13, in the case of forming a single-sided FPCB for the folding region which is substantially folded, the folding stress applied to the display panel 210 may be reduced and the damage to the conductive lines on at least one side or the via holes formed at the ends of the conductive lines may be prevented.

The multiple first conductive lines elongated in a fifth direction (e.g., direction parallel with folding axis (A-A')) on the first layer 213 may be formed spaced a predetermined distance apart from each other (in direction parallel with x axis in FIG. 6A). Accordingly, even the touch panel 210 have the single-sides FPCB shape in the first folding region R1, the recognition performance of the touch panel 210 may not be significantly affected. That is, according to certain embodiments of the disclosure, it is advantageous that the impact on the recognition performance of the touch panel 210 can be reduced and the folding stress can be reduced as well.

The conductive material 215 according to certain embodiments of the disclosure may be formed outside the first folding region R1 and/or the second folding region R2. According to an embodiment, the case in which the conductive material 215 is formed outside the first folding region R1 may refer to the case in which the conductive material 215 is formed outside the first boundary spaces the first distance apart from the folding axis (A-A'), and the case in which the conductive material 215 is formed outside the second folding region R2 may refer to the case in which the conductive material 215 is formed outside the second boundary spaces the second distance apart from the folding axis (A-A'). In FIG. 12 and FIG. 13, it is shown that the conductive material 215 is formed outside the second folding region R2 to prevent the conductive material 215 from being damaged. Accordingly, when the touch panel 210 is fully folded as shown in FIG. 13, the conductive material 215 is not directly bent and thus the conductive material may be prevented from being damaged.

Figures 14A, 14B:
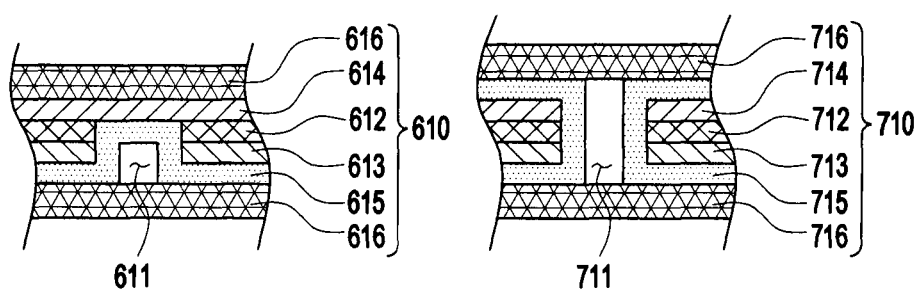
FIG. 14A is a cross-sectional view illustrating a touch panel according to an embodiment.
FIG. 14B is a cross-sectional view illustrating a touch panel according to another embodiment.

FIG. 14A is a cross-sectional view illustrating a touch panel according to an embodiment. FIG. 14B is a cross-sectional view illustrating a touch panel according to another embodiment. FIG. 14A may show a touch panel 610 having a via hole 611 formed through a blind via hole (BVH) construction method, according to an embodiment of the disclosure, and FIG. 14B may show a touch panel 710 having a via hole 711 formed through a plated through hole (PTH) construction method according to another embodiment of the disclosure.

When viewing the cross-sectional surface of the touch panel 610 or 710 through FIG. 14A and FIG. 14B, the touch panel 610 or 710 according to certain embodiments may include a first layer 613 or 713, a second layer 614 or 714, a base layer 612 or 712 between the first layer 613 or 713 and the second layer 614 or 714, and a conductive material 615 or 715 formed to surround at least a portion of the first layer 613 or 713 or at least a portion of the second layer 614 or 714 and configured to form a via hole. The touch panel 610 or 710 may include an insulation layer 616 or 716 surrounding at least one surface of the conductive material 615 or 715.

According to an embodiment, patterns on one side and the other side of the double-sided FPCB may be electrically connected by plating a conductive material onto the via hole 611 or 711 formed at FPCB.

When forming a via hole, as shown in FIG. 14A, a blind via hole (BVH) construction method by which layers may be penetrated while one side (e.g., second layer) of the double-sided FPCB is not completely penetrated may be used. Alternatively, as shown in FIG. 14B, a plated through hole (PTH) construction method by which one side and the other side (e.g., first layer and second layer) of the double-sided FPCB are penetrated through may be used.

Hereinafter, the embodiments of FIG. 15 and FIG. 16 may show a touch panel structure formed by applying a PTH construction method and the embodiments of FIG. 17 to FIG. 20 may show a touch panel structure formed by applying a BVH construction method.

Figure 15:
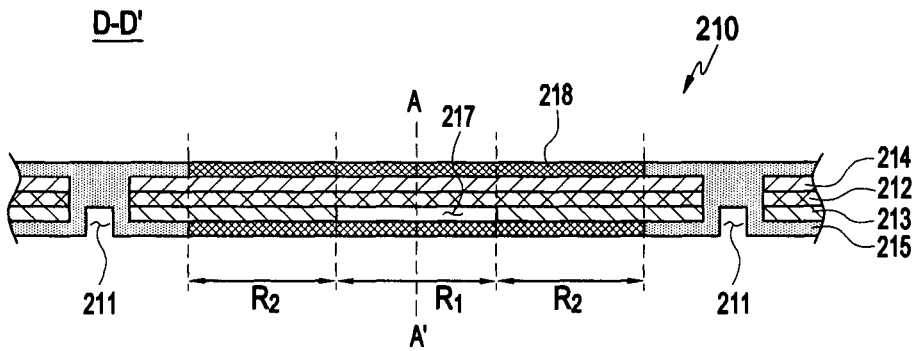
FIG. 15 is a cross-sectional view illustrating a touch panel including masking layers respectively attached to a first layer and a second layer according to certain embodiments of the disclosure.

FIG. 15 is a cross-sectional view illustrating a touch panel 210 including masking layers 218 respectively attached to a first layer 213 and a second layer 214 according to certain embodiments of the disclosure. FIG. 16 is a cross-sectional view illustrating a touch panel 210 according to an embodiment different from FIG. 15.

Referring to FIG. 15, with reference to the embodiment of FIG. 12, the masking layer 218 is shown to be formed on a portion in which a conductive material 215 is not formed. The separate making layer 218 includes a material having higher durability against folding than that of the conductive material 215 and may function to protect patterns formed on both sides of a base layer 212. According to certain embodiments, the masking layer 218 may be stacked on at least one surface of the first layer and/or at least one surface of the second layer and formed adjacent to the conductive material 215.

FIG. 15 shows that the masking layer 218 instead of the conductive material 215 is formed on the entire area (i.e., including all of first folding region and second folding region) to which the folding stress is applied.

Figure 16:
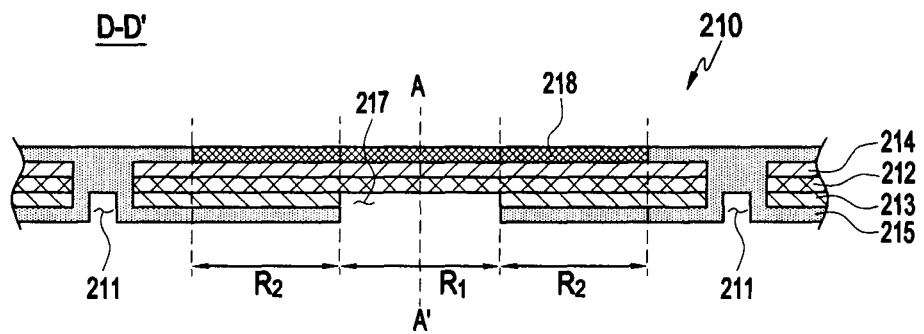
FIG. 16 is a cross-sectional view illustrating a touch panel according to an embodiment different from FIG. 15.

FIG. 16 illustrates an embodiment that is different from that of FIG. 15. FIG. 16 shows the touch penal 210 in which the masking layer 218 is attached to one side (e.g., second layer 214) of the base layer 212 and the conductive material 215 is attached to the other side (e.g., first layer 213) of the base layer 212.

According to an embodiment, the conductive material 215 may thus be included in an area (second folding region) to which less folding stress is applied.

Referring to FIG. 15 and FIG. 16 together, when the upper portion of the touch panel 210 shown in FIG. 15 and FIG. 16 is the portion in contact with the display, among the upper portion in contact with the display and the lower portion positioned in a direction opposite to the upper portion, the making layer 218 may be applied to the folding region of the upper portion and the conductive material 215 may be applied to the folding region of the lower portion.

Hereinafter, FIG. 17 to FIG. 20 show that a via hole is formed by filling a vial hole 211 with a conductive material according to a BVH construction method. In describing the following embodiments, descriptions overlapping the above-described embodiments may be omitted for convenience. In addition, in the following embodiments, configurations not inconsistent with the above-described embodiments may be applied with modification to the above-described embodiments.

Figure 17:
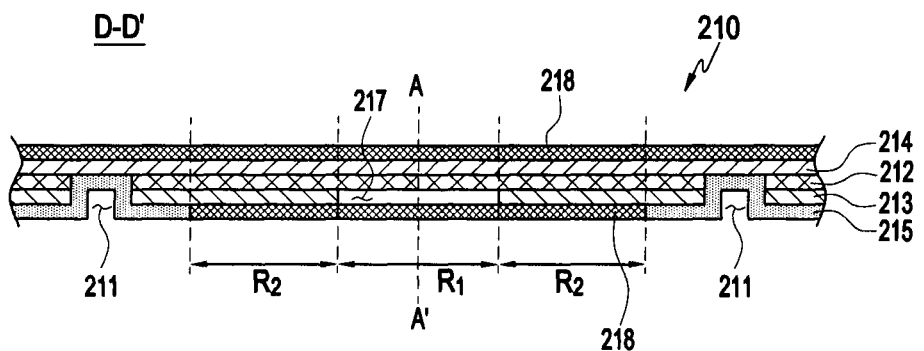
FIG. 17 is a cross-sectional view illustrating a touch panel of which at least one whole surface is attached by a masking layer according to certain embodiments of the disclosure.
Figure 18:
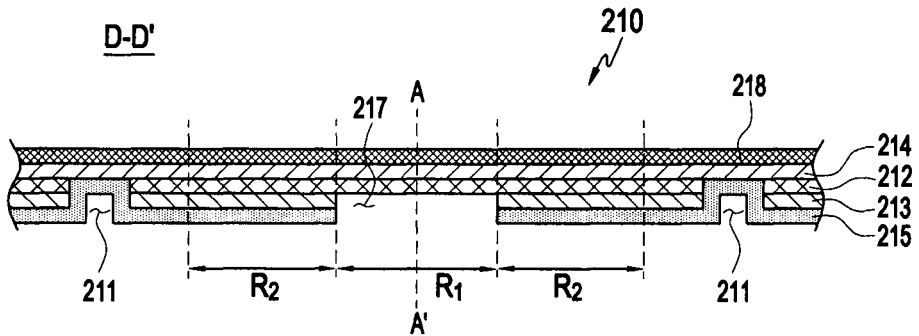
FIG. 18 is a cross-sectional view illustrating a touch panel according to embodiments different from FIG. 17.

FIG. 17 is a cross-sectional view illustrating a touch panel 210 of which at least one whole surface is attached by a masking layer 218 according to certain embodiments of the disclosure. FIG. 18 is a cross-sectional view illustrating a touch panel 210 according to other embodiments different from FIG. 17.

FIG. 17 and FIG. 18 show the touch panel 210 having one whole side (e.g., upper portion) formed of the making layer 218. According to an embodiment, referring to FIG. 17, the other side (e.g., lower portion) of the touch panel 210 may be also formed of the making layer 218. In another embodiment, referring to FIG. 18, the other side (e.g., lower portion) to which less folding stress is applied than to the upper portion of the touch panel 210 may be formed of the conductive material 215.

Figure 19:
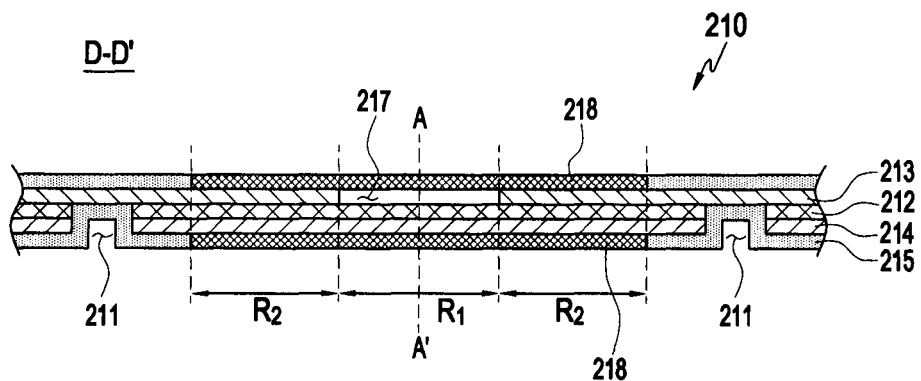
FIG. 19 is a cross-sectional view illustrating a touch panel having a first conductive line formed adjacent to a display.
Figure 20:
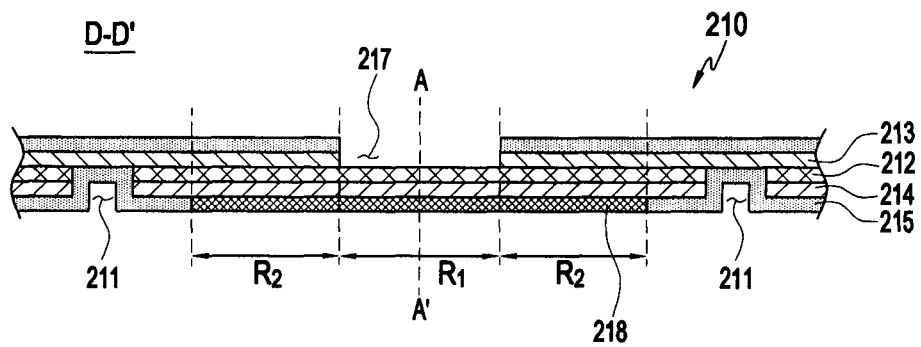
FIG. 20 is a cross-sectional view illustrating a touch panel according to other embodiments different from FIG. 19.

FIG. 19 is a cross-sectional view illustrating a touch panel 210 having multiple first conductive lines formed adjacent to a display. FIG. 20 is a cross-sectional view illustrating a touch panel 210 according to other embodiments different from FIG. 19.

As described above, an embodiment of the disclosure may include an embodiment in which conductive lines (e.g., multiple first conductive lines) on the first layer 213 and conductive lines (e.g., multiple second conductive lines) on the second layer 214 are formed by replacing each other.

In addition, certain embodiments of the disclosure may also include an embodiment in which, with reference to the base layer 212, the first layer 213 having the multiple first conductive lines formed thereon and the second layer 214 having the multiple second conductive lines formed thereon are replaced with each other.

As shown in FIG. 19 and FIG. 20, with reference to the base layer 212, the first layer 213 having the multiple first conductive lines formed thereon may be positioned at one side (e.g., upper portion) of the touch panel 210 to be adjacent to the display and the second layer 214 having the multiple second conductive lines formed thereon may be positioned at the other side (e.g., lower portion) of the touch panel 210. In here, the opening 217 which is formed at the first layer 213, corresponding to the first folding region R1 to which largest folding stress is applied, may be formed at one side (e.g., upper portion) of the touch panel 210.

In the embodiment of FIG. 19 and FIG. 20, even within an area to which the folding stress is applied, as the opening 217 is formed on one side (e.g., upper portion) of the touch panel 210, a smaller folding stress may be applied thereto than the other side (e.g., lower portion) of the touch panel 210. Accordingly, as shown in FIG. 20, the masking layer 218 may be employed on the other side (e.g., a lower portion) of the touch panel 210 and the conductive material 215 may be employed on the upper portion of the touch panel 210.

Hereinafter, with reference to FIG. 21 to FIG. 24B, certain embodiments of a magnetic shielding member 220 will be described.

Figure 21:
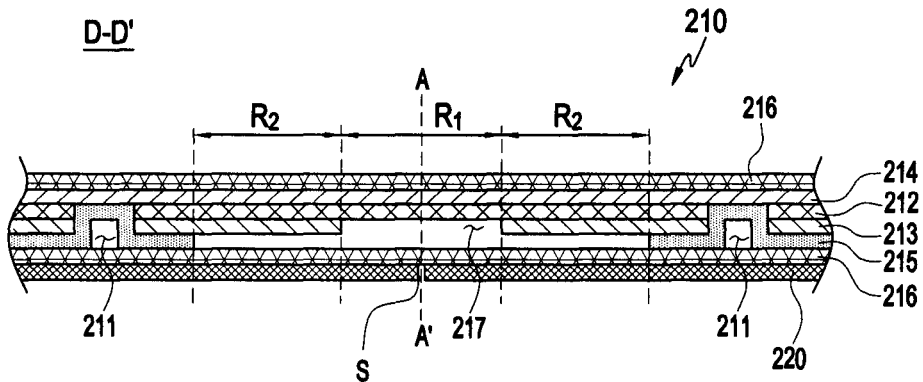
FIG. 21 is a view illustrating a touch panel to which a magnetic shield member according to a first embodiment is attached according to certain embodiments of the disclosure.
Figure 22:
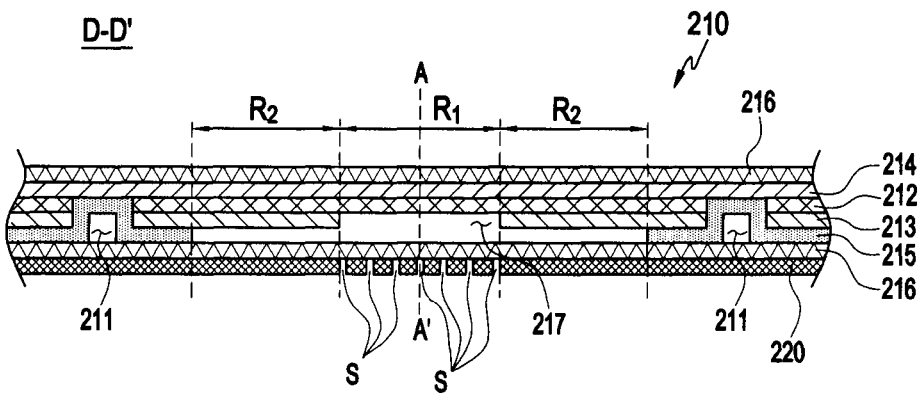
FIG. 22 is a view illustrating a touch panel to which a magnetic shield member according to a second embodiment is attached according to certain embodiments of the disclosure.
Figure 23:
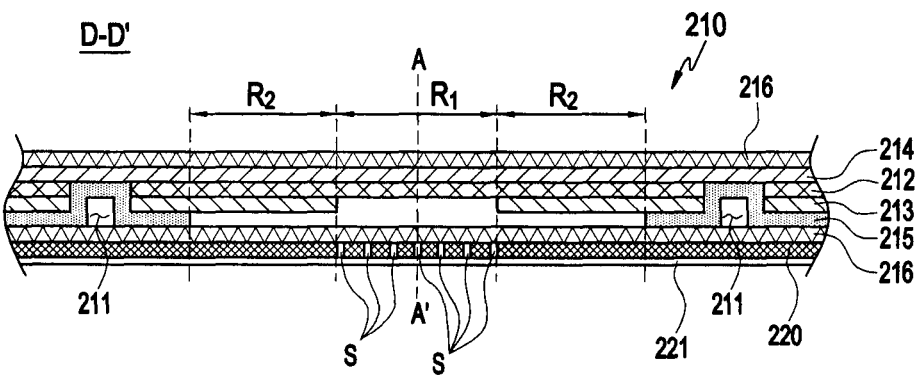
FIG. 23 is a view illustrating a touch panel to which a magnetic shield member according to a third embodiment is attached according to certain embodiments of the disclosure.

FIG. 21 is a view illustrating a touch panel 210 to which a magnetic shield member 220 according to a first embodiment is attached according to certain embodiments of the disclosure. FIG. 22 is a view illustrating a touch panel 210 to which a magnetic shield member 220 according to a second embodiment is attached according to certain embodiments of the disclosure. FIG. 23 is a view illustrating a touch panel 210 to which a magnetic shield member 220 according to a third embodiment is attached according to certain embodiments of the disclosure.

The touch panel 210 according to certain embodiments of the disclosure may include a first layer 213, a second layer 214, a base layer 212 disposed between the first layer 213 and the second layer 214, and a conductive material 215 formed to surround at least a portion of the first layer 213 or at least a portion of the second layer 214, and may further include an insulation layer 216 stacked on at least one surface of the conductive material 215 and configured to insulate at least a portion of the conductive material 215. A magnetic shield member 220 may be disposed on the touch panel 210 to shield components (e.g., electronic components) disposed around the touch panel 210 from electronic magnetic noise.

The magnetic shield member 220 may be formed, for example, by affixing a magnetic shield material in a form of sprayed powder on a rear surface of the touch panel 210 and the magnetic shield member disposed in the folding stress area may suffer damage (e.g., micro-fissures, cracking, etc.) upon repeated folding operations. Even the microdamage of the magnetic shield member 220 may cause performance degradation.

In order to prevent the damage of the magnetic shield member 220 upon folding operations of the electronic device (e.g., electronic device 101 in FIG. 2), an embodiment of FIG. 21 to FIG. 24B, for example, may be provided.

Referring to FIG. 21, the magnetic shield member 220 may include a slit S in an area corresponding to the folding axis (A-A'). The slit S may extend along a longitudinal direction of the magnetic shield member 220, and the width of the slit S may vary according to various embodiments. When the thickness of the slit S extends as much as the width of a folding region (e.g., first folding region S1) of the electronic device, performance degradation may occur, and therefore, the thickness of the slit may be smaller than the width of the folding region (e.g., width R1 of first folding region).

Referring to FIG. 22, the magnetic shield member 220 may include multiple slits S. The multiple slits S may also extend along a longitudinal direction (e.g., or a direction parallel with folding axis) of the magnetic shield member 220, and the width of each slit S may also vary according to various embodiments. According to an embodiment, the width of respective slit s of FIG. 22 may be smaller than that of the slit S of FIG. 21. In an embodiment of FIG. 22, the multiple slits may be formed by scratching the magnetic shield member with a member having a pointed end.

Referring to FIG. 23, the magnetic shield member 220 may additionally include a protection layer 221 on the rear surface thereof. The protection layer 221 may include at least a portion of the protection member 230 shown in FIG. 6A, but may also be separately provided from the protection member 230 shown in FIG. 6A. According to an embodiment, the protection layer 221 may be implemented using a separate film, a coating agent, or an adhesive implemented using a material such as polyimide (PI) and polyethyleneterephthalate (PET). The portion of the magnetic shield member 220, to which stress is applied during folding operations may be surrounded by using the protection layer 221, and thus cracking in the magnetic shield member 220 may be prevented.

The protection layer 221 may be provided in a form of being stacked on the rear surface of the magnetic shield member 220 including the multiple slits S shown in FIG. 23, or may be formed on the rear surface of the magnetic shield member 220 without a slit.

The magnetic shield member 220 according to certain embodiments, although not shown in FIG. 21 to FIG. 23, in a state of including a slit S formed thereon, may prevent the magnetic shield performance degradation by further including, in the slit S, a magnetic powder finer than a magnetic shield material configured to form the magnetic shield member 220.

The magnetic shield member 220 according to certain embodiments may employ certain embodiments other than the embodiment illustrated through FIG. 21 to FIG. 23.

Figure 24A:
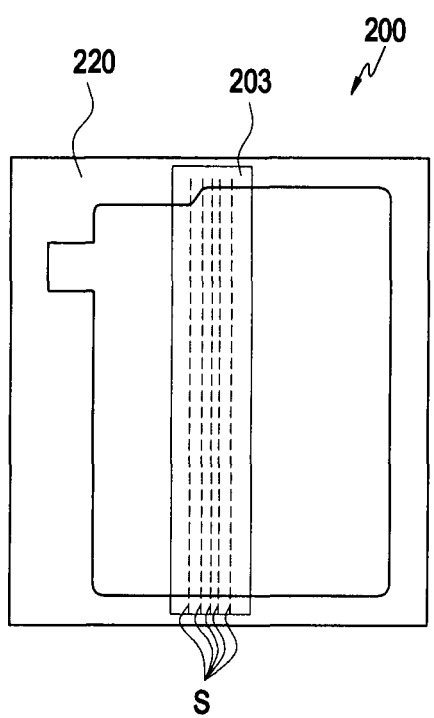
FIG. 24A is a view illustrating a magnetic shield member according to an embodiment.
Figure 24B:
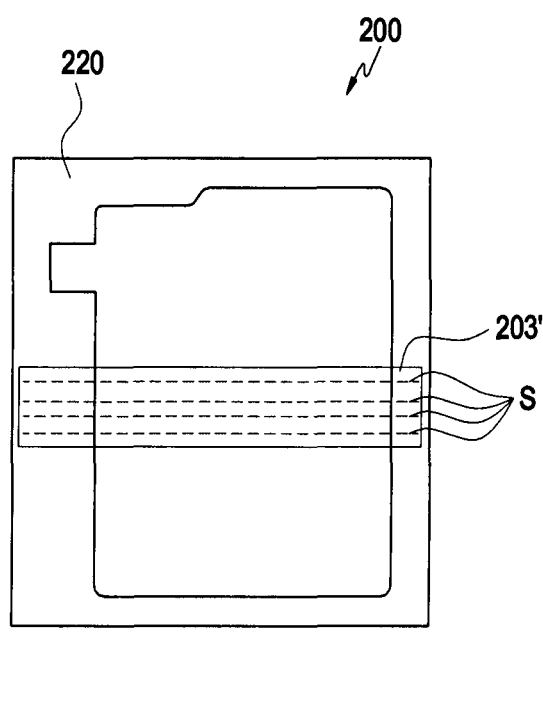
FIG. 24B is a view illustrating a magnetic shield member according to another embodiment.

FIG. 24A is a view illustrating a magnetic shield member according to an embodiment. FIG. 24B is a view illustrating a magnetic shield member according to another embodiment. FIG. 24A and FIG. 24B show a schematic view of a display 200 including a magnetic shield member 220.

According to certain embodiments, the display 200 may include a folding region 203. The folding region 203 according to an embodiment may be parallel with the vertical length of the display 200 as shown in FIG. 24A. The folding region 203' according to another embodiment may be parallel with the horizontal length of the display 200 as shown in FIG. 24B.

According to certain embodiments, the multiple slits S formed on the magnetic shield member 220 may extend in a direction parallel with the folding region 203.

Figure 25A:
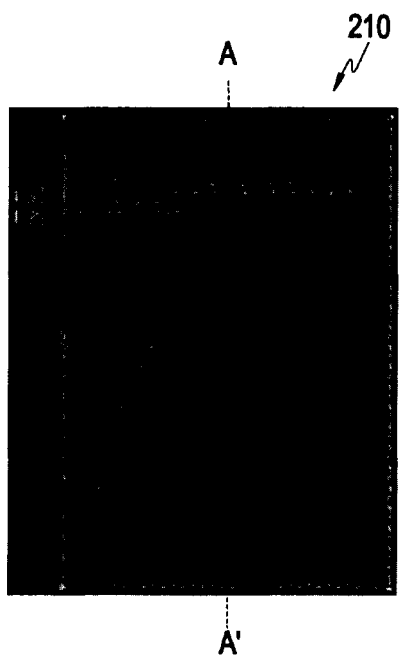
FIG. 25A is a view illustrating conductive lines formed in a touch panel in an electronic device according to an embodiment.
Figure 25B:
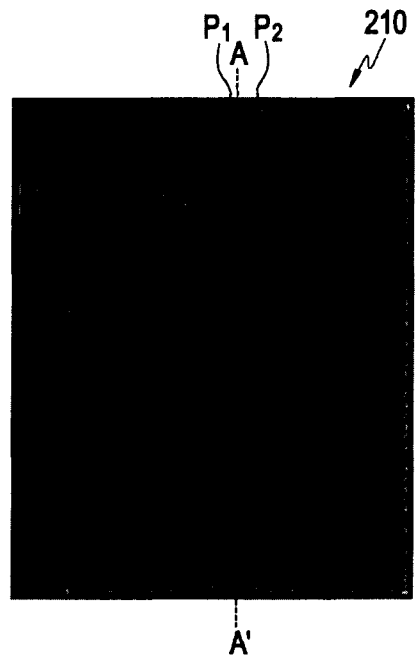
FIG. 25B is a view illustrating conductive lines formed in a touch panel in an electronic device according to certain embodiments of the disclosure.

FIG. 25A is a view illustrating conductive lines formed in a touch panel in an electronic device according to an embodiment. FIG. 25B is a view illustrating conductive lines formed in a touch panel in an electronic device according to certain embodiments of the disclosure.

The multiple conductive lines may include both multiple conductive lines (e.g., multiple first conductive line in FIG. 11) parallel with the folding axis (A-A') of the touch panel 210, and multiple conductive lines (e.g., multiple second conductive lines of FIG. 11) perpendicular to the folding axis (A-A'). When the touch panel 210 is viewed from the front shown in FIG. 25A and FIG. 25B, the conductive lines may be electrically connected to an end (e.g., up/down/right/left) of the touch panel 210. According to the embodiment of FIG. 25A, in the case of the conductive lines, out of many lines, included in the folding region or adjacent to the folding region, an area having a via hole formed therein may be particularly susceptible. Therefore, according to certain embodiments of the disclosure, with reference to the embodiment of FIG. 25A, damage to the touch panel 210 may be prevented, by disposing the via hole included in the folding region or adjacent to the folding axis at a position spaced away from the folding axis (e.g., position spaced a predetermined distance away from folding axis). In addition, damage to the touch panel 210 may be prevented by designing a portion of touch panel 210 in the folding region as a single-sided FPCB. Furthermore, damage to the touch panel 210 may be prevented by forming a conductive material for forming the via hole at an appropriate position according to the folding region.

Certain embodiments of the disclosure may provide an electronic device (e.g., electronic device 101 in FIG. 2) including a foldable housing (e.g., foldable housing 300 in FIG. 2) including a hinge structure (e.g., hinge structure 510 in FIG. 4); a first housing (e.g., first housing 310 in FIG. 4) connected to the hinge structure and including a first surface (e.g., first surface 311 in FIG. 4) facing a first direction and a second surface (e.g., second surface 312 in FIG. 4) facing a second direction opposite to the first direction; and a second housing (e.g., second housing 320 in FIG. 4) connected to the hinge structure, including a third surface (e.g., third surface 321 in FIG. 4) facing a third direction and a fourth surface (e.g., fourth surface 322 in FIG. 4) facing a fourth direction opposite to the third direction, and folded toward the first housing around the hinge structure, and a display (e.g., display 200 in FIG. 4) extending from the first surface of the first housing to the third surface of the second housing so as to form the first surface and the third surface, such that the display includes a first layer (e.g., first layer 213 in FIG. 12) and/or a second layer (e.g., second layer 214 in FIG. 12) substantially parallel with the first surface or the third surface, such that the first layer, when viewed from above the first surface or the third surface, includes multiple first conductive lines (e.g., multiple first conductive lines Y11, Y12, Y13, Y14, Y21, Y22, Y23, and Y24 in FIG. 11) extending parallel with each other in a fifth direction, such that the second layer, when viewed from above the first surface or the third surface, includes multiple second conductive lines (e.g., multiple second conductive lines X1, X2, X3, and X4 in FIG. 11) extending parallel in a sixth direction substantially perpendicular to the fifth direction, and the multiple second conductive lines intersect the multiple first conductive lines, such that the display includes multiple conductive vias (e.g., multiple conductive vias 211a, 211a', 211b, 211b', 211c, 211c', 211d, and 211d' in FIG. 11) formed between the first layer and the second layer to electrically connect at least a portion of the first multiple conductive lines and at least a portion of the second multiple conductive lines, such that the display includes a folding region (e.g., folding region 203 in FIG. 4) by which the housing is folded, and the conductive vias are arranged outside the folding region.

According to certain embodiments, the display may be configured to include one of the first layer or the second layer in the folding region (e.g., but in some embodiments, not both layers).

According to certain embodiments, the first multiple conductive lines, together with the second multiple conductive lines, may form a portion of at least one loop coil.

According to certain embodiments, a shield member (e.g., 220 in FIG. 21) between the display and the second surface and between the display and the fourth surface may be further included.

According to certain embodiments, a reception space (e.g., reception space 342 in FIG. 5A) configured to receive an input device (e.g., input device 150 in FIG. 5A) may be further included.

According to certain embodiments, a portion of at least one of the multiple first conductive lines may face a direction different from the fifth direction and may be formed to be spaced apart from the folding axis.

According to certain embodiments, a via hole may be formed at an end of at least one of the multiple first conductive lines disposed in the folding region or adjacent to the folding region and formed at a position (e.g., P1 or P2 in FIG. 11) spaced a predetermined distance from the folding axis.

According to certain embodiments, the multiple first conductive lines may include a (1-1)th conductive line (e.g., (1-1)th conductive line Y11 or Y21 in FIG. 11), a (1-2)th conductive line (e.g., (1-2)th conductive line Y12 or Y22 in FIG. 11), and a (1-3)th conductive line (e.g., (1-3)th conductive line Y13 or Y33 in FIG. 11) formed parallel with each other in a direction away from the folding axis, such that as the multiple conductive vias, a first via hole (e.g., first via hole 211a or 211a' in FIG. 11) is formed at an end of the (1-1)th conductive line, a second via hole (e.g., second via hole 211b or 211b' in FIG. 11) is formed at an end of the (1-2)th conductive line, and a third via hole (e.g., third via hole 211c or 211c' in FIG. 11) is formed at an end of the (1-3)th conductive line.

According to certain embodiments, the (1-1)th conductive line may be disposed in the folding region or adjacent to the folding region, such that a portion of the (1-1)th conductive line (e.g., a portion Y11' or Y21' of (1-1)th conductive line in FIG. 11) may extend in a direction away from the folding axis so that the first via hole is spaced a predetermined distance from the folding region (e.g., P1 or P2 in FIG. 11).

According to certain embodiments, the (1-2)th conductive line may be disposed in the folding region or adjacent to the folding region, such that a portion of the (1-2)th conductive line (e.g., a portion Y12' or Y22' of (1-2)th conductive line in FIG. 11) may extend in a direction away from the folding axis so that the second via hole is spaced a predetermined distance from the folding region, such that the second via hole may be disposed adjacent to the first via hole at a position farther away from the folding axis than the first via hole (e.g., P1 or P2 in FIG. 11).

According to certain embodiments, first boundaries (e.g., first boundaries L1 and L1' in FIG. 11) in two different positions spaced a first distance (e.g., first distance D1 or D1' in FIG. 11) apart from the folding axis to one side and the other side, respectively and second boundaries (e.g., second boundaries L2 and L2' in FIG. 11) in two different positions spaced a second distance (e.g., second distance D2 and D' in FIG. 11) longer than the first distance apart from the folding axis, respectively may be included, such that the folding region may include a first folding region (e.g., first folding region R1 in FIG. 12) formed between the first boundaries in the two different positions and second folding regions (e.g., second folding region R2 in FIG. 12) formed between the first boundary positioned at one side of the folding axis and the second boundary positioned at one side of the folding axis, such that the first layer in the first folding region may include an opening (e.g., opening 217 in FIG. 12).

According to certain embodiments, a base layer (e.g., base layer 212 in FIG. 12) may be further included between the first layer and the second layer, and a conductive material (e.g., conductive material 215 in FIG. 12) formed to surround at least a portion of the first layer and at least a portion of the second layer and configured to form the multiple conductive vias may be further included.

According to certain embodiments, with reference to the folding axis, the conductive material may be formed outside a first boundary spaced a first distance apart from the folding axis or outside a second boundary spaced a second distance longer than the first distance apart from the folding axis.

According to certain embodiments, an insulation layer (e.g., insulation layer 216 in FIG. 21) stacked with the conductive material and configured to insulate at least a portion of the conductive material may be further included.

According to certain embodiments, a masking layer (e.g., masking layer 218 in FIG. 15) stacked with at least one surface of the first layer or at least one surface of the second layer and formed adjacent to the conductive material may be further included.

Certain embodiments of the disclosure may provide an electronic device (e.g., electronic device 101 in FIG. 2) including a foldable housing (e.g., foldable housing 300 in FIG. 2) including a folding region (e.g., folding region 203 in FIG. 2) where the electronic device is substantially folded about a folding axis (e.g., folding axis (A-A') in FIG. 2), the foldable housing including a hinge structure (e.g., hinge structure 510 in FIG. 4) including the folding axis; a first housing (e.g., first housing 310 in FIG. 4) including a first surface (e.g., first surface 311 in FIG. 4) facing a first direction and a second surface (e.g., second surface 312 in FIG. 4) facing a second direction opposite to the first direction; and a second housing (e.g., second housing 320 in FIG. 4) connected to the hinge structure, including a third surface (e.g., third surface 321 in FIG. 4) facing a third direction and a fourth surface (e.g., fourth surface 322 in FIG. 4) facing a fourth direction opposite to the third direction, and folded toward the first housing around the hinge structure, and a display (e.g., display 200 in FIG. 4) extending from the first surface of the first housing to the third surface of the second housing, such that the display may include a first layer (e.g., first layer 213 in FIG. 12) including multiple first conductive lines (e.g., multiple first conductive lines Y11, Y12, Y13, Y14, Y21, Y22, Y23, and Y24 in FIG. 11) of which at least a portion extends toward the fifth direction; a second layer (e.g., second layer 214 in FIG. 12) including multiple second conductive lines (e.g., multiple second conductive lines X1, X2, X3, and X4 in FIG. 11) of which at least a portion extends toward sixth direction substantially perpendicular to the fifth direction; a base layer (e.g., base layer 212 in FIG. 12) disposed between the first layer and the second layer; and a conductive material (e.g., conductive material 215 in FIG. 12) formed to surround at least a portion of the first layer or at least a portion of the second layer and configured to form the multiple conductive vias, and such that the first layer includes an opening (e.g., opening 217 in FIG. 12) formed at a first folding region (e.g., first folding region R1 in FIG. 12) defining a first boundary spaced a first distance apart from the folding axis.

According to certain embodiments, the conductive material may be formed outside a second folding region (e.g., second folding region R2 in FIG. 12) spaced a second distance apart from the folding axis.

According to certain embodiments, at least one of the multiple first conductive lines may have a portion facing a direction different from the fifth direction and formed to be spaced apart from the folding axis, and a via formed at one end thereof to be electrically connected to a second conductive line, and the via may be formed spaced a predetermined distance apart from the folding region.

Certain embodiments of the disclosure may provide an electronic device (e.g., electronic device 101 in FIG. 2) including a foldable housing (e.g., fordable housing 300 in FIG. 2) including a folding region (e.g., folding region 203 in FIG. 2) where the electronic device is substantially folded about a folding axis; a display panel (e.g., display panel 200c in FIG. 6A) which is visible from the outside through at least a portion of the foldable housing; and a touch panel (e.g., touch panel 210 in FIG. 6A or touch panel 210 in FIG. 11) disposed at the rear surface of the display panel. The touch panel may include a first layer (e.g., first layer 213 in FIG. 12) including multiple first conductive lines (e.g., multiple first conductive lines Y11, Y12, Y13, Y14, Y21, Y22, Y23, and Y24 in FIG. 11) of which at least a portion extends in a direction parallel with the folding axis; and a second layer (e.g., second layer 214 in FIG. 12) including multiple second conductive lines (e.g., multiple second conductive lines X1, X2, X3, and X4 in FIG. 11) of which at least a part extends in a direction perpendicular to the folding axis, such that at least one of the multiple first conductive lines, adjacent to the folding axis, has a portion formed to be away from the folding axis in the direction perpendicular to the folding axis, the at least one of the multiple first conductive lines has, at the end thereof, a via for electrical connection to at least one of the multiple second conductive lines, the via is formed at a position spaced at least a predetermined distance apart from the folding region, and the first layer includes an opening (e.g., opening 217 in FIG. 12) formed in a first folding region (e.g., first folding region R1 in FIG. 12) which defines a first boundary spaced a first distance apart from the folding axis.

According to certain embodiments, the touch panel may further include a base layer (e.g., base layer 212 in FIG. 12) between the first layer and the second layer; and a conductive material (e.g., conductive material 215 in FIG. 12) formed to surround at least a portion of the first layer or at least a portion of the second layer, and configured to form a via hole (e.g., via hole 211a, 211a', 211b, 211b', 211c, 211c', 211d, or 211d' in FIG. 11), such that the conductive material may be formed outside a second folding region (e.g.; second folding region R2 in FIG. 12) spaced a second distance apart from the folding axis.

The electronic device of certain embodiments described above is not limited to the embodiment and drawing described above, and it will be apparent to those of ordinary skill in the art to which the present disclosure pertains that various substitutions, modifications, and changes are possible within the technical scope of the present disclosure.

What is claimed is:

1. An electronic device, comprising:
   a foldable housing, including:
      a hinge structure defining a folding axis of the foldable housing,
      a first housing coupled to the hinge structure and including a first surface facing a first direction, and a second surface facing a second direction opposite to the first direction, and
      a second housing coupled to the hinge structure, including a third surface facing a third direction, and a fourth surface facing a fourth direction opposite to the third direction, the second housing folded toward the first housing around the hinge structure; and
   a display spanning across the first surface of the first housing to the third surface of the second housing,
   wherein the display includes a first layer and a second layer disposed substantially parallel with the first surface or the third surface,
   wherein the first layer, when viewed from above the first surface or the third surface, includes multiple first conductive lines extending parallel with each other in a fifth direction,
   wherein the second layer, when viewed from above the first surface or the third surface, includes multiple second conductive lines extending parallel in a sixth direction substantially perpendicular to the fifth direction, the multiple second conductive lines intersecting with the multiple first conductive lines,
   wherein the display includes multiple conductive vias formed between the first layer and the second layer to electrically couple at least a portion of the first multiple conductive lines and at least a portion of the second multiple conductive lines,
   wherein the display comprises a folding region including the folding axis about which the housing is folded, and the conductive vias are disposed outside the folding region, and
   wherein the multiple first conductive lines, together with the multiple second conductive lines, form a portion of at least one loop coil.

2. The electronic device of claim 1, wherein the display further includes one of the first layer or the second layer in the folding region.

3. The electronic device of claim 1, further comprising: a shield member disposed between the display and the second surface, and between the display and the fourth surface.

4. The electronic device of claim 1, further comprising: a reception space configured to receive an external input device within the foldable housing.

5. The electronic device of claim 1, wherein a portion of at least one of the multiple first conductive lines faces a direction different from the fifth direction, and is disposed spaced apart from the folding axis.

6. The electronic device of claim 1, wherein a via hole is formed at a terminal end of at least one of the multiple first conductive lines disposed either in or proximate to the folding region, and spaced apart from the folding axis by a predetermined distance.

7. The electronic device of claim 1, wherein the multiple first conductive lines include at least a (1-1)th conductive line, a (1-2)th conductive line, and a (1-3)th conductive line formed parallel with each other and extending in a direction away from the folding axis, and wherein the multiple conductive vias include at least a first via hole formed at an end of the (1-1)th conductive line, a second via hole formed at an end of the (1-2)th conductive line, and a third via hole formed at an end of the (1-3)th conductive line.

8. The electronic device of claim 7, wherein the (1-1)th conductive line is disposed within or proximate to the folding region, and
wherein a portion of the (1-1)th conductive line extends in a direction away from the folding axis so that the first via hole is spaced by a predetermined distance away from the folding region.

9. The electronic device of claim 8, wherein the (1-2)th conductive line is disposed within or proximate to the folding region,
wherein a portion of the (1-2)th conductive line extends in a direction away from the folding axis so that the second via hole is spaced by the predetermined distance away from the folding region, and
wherein the second via hole is disposed adjacent to the first via hole such that the second via hole is spaced by another distance greater than the predetermined distance away from the folding axis.

10. The electronic device of claim 1, wherein:
a first set of boundaries are defined in two different positions around the folding axis and spaced by a first distance apart from the folding axis, and
a second set of boundaries are defined in two different positions around the folding axis and spaced by a second distance greater than the first distance apart from the folding axis,
wherein the folding region includes a first folding region formed between the first set of boundaries in the two different positions, and second folding regions formed between the first set of boundaries and the second set of boundaries, and
wherein the first layer in the first folding region defines an opening.

11. The electronic device of claim 1, further comprising:
a base layer disposed between the first layer and the second layer, and
a conductive material surrounding at least a portion of the first layer or the second layer, the conductive material at least partially forming the multiple conductive vias.

12. The electronic device of claim 11, wherein the conductive material is disposed beyond a first boundary spaced by a first distance apart from the folding axis, or beyond a second boundary spaced a second distance greater than the first distance apart from the folding axis.

13. The electronic device of claim 11, further comprising:
an insulation layer stacked with at least one surface of the conductive material, and configured to insulate at least a portion of the conductive material.

14. The electronic device of claim 11, further comprising:
a masking layer stacked with at least one surface of the first layer or at least one surface of the second layer, and disposed adjacent to the conductive material.

15. An electronic device, comprising:
a foldable housing including a folding region where the electronic device is substantially folded about a folding axis, wherein the foldable housing includes:
a hinge structure including the folding axis;
a first housing including a first surface facing a first direction and a second surface facing a second direction opposite to the first direction; and
a second housing coupled to the hinge structure, including a third surface facing a third direction and a fourth surface facing a fourth direction opposite to the third direction, and folded toward the first housing around the hinge structure, and
a display spanning across the first surface of the first housing to the third surface of the second housing,
wherein the display includes:
a first layer including multiple first conductive lines of which at least a portion extends toward a fifth direction;
a second layer including multiple second conductive lines of which at least a portion extends toward sixth direction substantially perpendicular to the fifth direction;
a base layer disposed between the first layer and the second layer; and
a conductive material surrounding at least a portion of the first layer or at least a portion of the second layer and configured to form the multiple conductive vias, and
wherein the first layer includes an opening disposed at a first folding region defining a first boundary spaced a first distance apart from the folding axis, and
wherein the multiple first conductive lines, together with the multiple second conductive lines, form a portion of at least one loop coil.

16. The electronic device of claim 15, wherein the conductive material disposed beyond a second folding region spaced a second distance apart from the folding axis.

17. The electronic device of claim 15, wherein the at least one of the multiple first conductive lines includes a portion facing a direction different from the fifth direction and is disposed spaced apart from the folding axis, and a via disposed at one end thereof to be electrically coupled to a second conductive line, and
wherein the via disposed spaced a predetermined distance apart from the folding region.

18. An electronic device, comprising:
a foldable housing including a folding region where the electronic device is substantially folded about a folding axis;
a display panel which is visible from the outside through at least a portion of the foldable housing; and
a touch panel disposed at the rear surface of the display panel,
wherein the touch panel includes:
a first layer including multiple first conductive lines of which at least a portion extends in a direction parallel with the folding axis; and
a second layer including multiple second conductive lines of which at least a part extends in a direction perpendicular to the folding axis,
wherein the at least one of the multiple first conductive lines, adjacent to the folding axis, includes a portion formed to be away from the folding axis in the direction perpendicular to the folding axis,
wherein the at least one of the multiple first conductive lines includes, at the end thereof, a via for electrical connection to at least one of the multiple second conductive lines,
wherein the via is disposed at a position spaced at least a predetermined distance apart from the folding region,
wherein the first layer includes an opening disposed in a first folding region which defines a first boundary spaced a first distance apart from the folding axis, and
wherein the multiple first conductive lines, together with the multiple second conductive lines, form a portion of at least one loop coil.

19. The electronic device of claim 18, wherein the touch panel further include a base layer between the first layer and the second layer; and a conductive material surrounding at least a portion of the first layer or at least a portion of the second layer, and configured to form a via hole,
    wherein the conductive material is disposed outside a second folding region spaced a second distance apart from the folding axis.

\* \* \* \* \*